United States Patent
Kern et al.

(10) Patent No.: US 10,514,852 B2
(45) Date of Patent: Dec. 24, 2019

(54) PROCESSING DATA IN MEMORY CELLS OF A MEMORY

(71) Applicant: Infineon Technologies AG, Neubiberg (DE)

(72) Inventors: Thomas Kern, Aschheim (DE); Michael Goessel, Mahlow (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/898,979

(22) Filed: Feb. 19, 2018

(65) Prior Publication Data

US 2018/0240517 A1 Aug. 23, 2018

(51) Int. Cl.
| | |
|---|---|
| *G06F 3/06* | (2006.01) |
| *G06F 11/10* | (2006.01) |
| *G11C 7/10* | (2006.01) |
| *G11C 7/06* | (2006.01) |
| *G11C 11/56* | (2006.01) |

(52) U.S. Cl.
CPC ........ *G06F 3/0619* (2013.01); *G06F 11/1048* (2013.01); *G06F 11/1072* (2013.01); *G11C 7/06* (2013.01); *G11C 7/1006* (2013.01); *G11C 11/5642* (2013.01)

(58) Field of Classification Search
CPC . G06F 3/0619; G06F 11/1072; G11C 7/1006; G11C 7/06; G11C 11/5642
See application file for complete search history.

(56) References Cited

U.S. PATENT DOCUMENTS

| | | | | |
|---|---|---|---|---|
| 5,978,275 A | * | 11/1999 | Song | G11C 16/16 365/185.11 |
| 8,996,951 B2 | | 3/2015 | Hyde et al. | |
| 9,985,791 B2 | * | 5/2018 | Cambou | H04L 9/3278 |
| 2002/0083390 A1 | * | 6/2002 | Lee | G06F 11/1072 714/763 |
| 2008/0219400 A1 | * | 9/2008 | Van Assche | G07C 3/04 377/77 |
| 2010/0046302 A1 | * | 2/2010 | Ogura | G11C 7/04 365/185.21 |
| 2011/0296274 A1 | | 12/2011 | Mittelholzer et al. | |
| 2013/0013870 A1 | | 1/2013 | Cronie et al. | |
| 2013/0125118 A1 | * | 5/2013 | Niesser | G06F 9/455 718/1 |
| 2013/0176780 A1 | | 7/2013 | Alhussien et al. | |
| 2014/0177322 A1 | | 6/2014 | Kwon et al. | |
| 2015/0085591 A1 | | 3/2015 | Mittelholzer et al. | |

(Continued)

*Primary Examiner* — Joseph D Torres
(74) *Attorney, Agent, or Firm* — Eschweiler & Potashnik, LLC

(57) ABSTRACT

A method for reading memory cells from a memory is stated, inter alia, in which physical values are determined from a number of n memory cells, wherein n is at least three, in which the physical values are at least partially compared with one another, in which K different digital memory cell values are assigned to the n memory cells on the basis of the compared physical values, and in which a code word of an $n_1$-, ..., $n_K$-out-of-n code is assigned to the digital memory cell values obtained in this manner. In particular, the following apply in this case: $n \geq 3$, $n_1 \geq 1$ to $n_K \geq 1$, $K \geq 2$ and $m \geq 1$.

21 Claims, 16 Drawing Sheets

(56) References Cited

U.S. PATENT DOCUMENTS

2015/0294739 A1* 10/2015 Cai ..................... G06F 11/1012
                                                        714/721
2016/0371028 A1* 12/2016 Berman ................. G06F 12/00
2017/0046223 A1*  2/2017 Kern ...................... G11C 29/52

* cited by examiner

PROCESSING DATA IN MEMORY CELLS OF A MEMORY

CROSS REFERENCE TO RELATED APPLICATIONS

This application claims priority to German Application number 10 2017 103 347.5 filed on Feb. 17, 2017, the contents of which are incorporated by reference in their entirety.

FIELD

The disclosure is directed to a method for reading memory cells, and an apparatus for processing memory cells from a memory.

BACKGROUND

Various approaches are known for storing data (for example binary data) in memory cells of a memory and reading data from the memory cells of the memory for further processing.

SUMMARY

The disclosure is directed to improving the handling of the memory and, in particular, to making storage and/or reading more efficient.

In one embodiment a method for reading memory cells from a memory is stated, in which physical values are determined from a number of n memory cells, wherein n is at least three, in which the physical values are at least partially compared with one another, in which K different digital memory cell values are assigned to the n memory cells on the basis of the compared physical values, and in which a code word of an $n_1$-, . . . , $n_K$-out-of-n code is assigned to the digital memory cell values obtained in this manner.

In one embodiment, the following apply in particular: $n \geq 3$, $n_1 \geq 1$ to $n_K \geq 1$, $K \geq 2$ and $m \geq 1$.

The number of memory cell values is n, wherein only K different digital values occur.

The following also applies: $n_1 + \ldots + n_K = n$.

The comparison of the physical values may comprise a comparison of analog values in one embodiment.

In one embodiment the comparison can be carried out on the physical values themselves or may be based on the physical values. In particular, values derived from the physical values can be compared. In this respect, comparisons which relate to values which can be derived from the physical values are also covered by the comparison of the physical values which is mentioned here.

As a result of the fact that the assignment of digital values to physical values is based on the physical values determined from a number of n memory cells being compared with one another, an incorrect assignment of the digital values occurs only rarely. Such an incorrect assignment of the digital values can take place only when physical values to be compared are in a region in which the frequency distributions of their values overlap and their sequence changes during the comparison.

In one embodiment the physical values are at least partially compared with one another, with the result that a sequence of at least some of the physical values is determined, and the K different digital memory cell values are assigned to the n memory cells on the basis of the sequence.

In one embodiment, a first digital memory cell value is determined for $n_1$ first memory cells in the sequence and a Kth digital memory cell value is determined for $n_K$ last memory cells in the sequence.

In particular, in one embodiment a digital memory cell value can be assigned on the basis of the position of the physical values in the sequence.

If a first digital memory cell value is determined for $n_1$ first memory cells in the sequence and if $n_1 \geq 2$, it may not be necessary to determine a sequence of the first $n_1$ memory cells. It may be sufficient in this case to determine that a memory cell belongs to the first $n_1$ memory cells without having to determine the position in the sequence of the first $n_1$ memory cells at which a memory cell is positioned. The same digital value 1 can be assigned to all $n_1$ first memory cells, for example.

Corresponding statements apply to further memory cells up to the $n_K$ Kth memory cells. It may be sufficient to determine a partially determined sequence or a sequence for a subset of the memory cell values.

In one embodiment the physical values are determined by reading the n memory cells.

In one embodiment all physical values are compared with one another.

In one embodiment K=2, with the result that the $n_1$-, . . . , $n_K$-out-of-n code is an $n_1$-,$n_2$-out-of-n code, wherein $n_1$ first memory cell values have the same first value among one another and $n_2$ second memory cell values have the same second value among one another, wherein the first value differs from the second value.

In one embodiment the $n_1$-,$n_2$-out-of-n code may also be referred to as an $n_1$-out-of-n code. In this case, $n_2 = n - n_1$.

In one embodiment K=3, with the result that the $n_1$-, . . . , $n_K$-out-of-n code is an $n_1$-,$n_2$-,$n_3$-out-of-n code, wherein $n_1$ first memory cell values have the same first value among one another, $n_2$ second memory cell values have the same second value among one another and $n_3$ third memory cell values have the same third value among one another, wherein the first value, the second value and the third value each differ from one another.

In one embodiment K>3.

In this example, more than three values may be determined for each memory cell, that is to say more than three digital memory cell values.

In one embodiment the memory cell values determined from the memory cells are determined by means of a uniquely reversible transformation.

The number n of memory cell values is, in one embodiment, less than twice the number of bits stored in the memory cells in this case.

In one embodiment the physical values are times.

In one embodiment a time is respectively determined by integrating the physical value of the memory cell over time.

In one embodiment the physical value is a read current of a memory cell.

In one embodiment, if the digital memory cell values obtained are a code word of an $n_1$-, . . . , $n_K$-out-of-n code, a number of m bits is determined from the code word by means of a back-transformation.

In one embodiment error detection and/or error correction of the m bits is carried out by means of an error code.

In one embodiment the error detection and/or error correction is carried out on the basis of check bits, wherein the check bits are determined from the data bits according to the error code.

In one embodiment the error detection and/or error correction is carried out on the basis of check bits, wherein the check bits are determined from the memory cell values according to the error code.

In one embodiment the error code is a byte error-correcting and/or a byte error-detecting code.

In one embodiment a byte comprises m bits if error correction of data bits is carried out and a byte comprises n bits if error correction of memory cells is carried out.

In one embodiment the error code is a bit error-correcting and/or a bit error-detecting code.

In one embodiment at least one reference value is used to determine the digital memory cell values.

In one embodiment the memory comprises at least one of the following memory types: a cache memory, a register or a register array, a flash memory, an MRAM, an SRAM, an RE-RAM, a PC-RAM, an FE-RAM, a CB-RAM, a multi-bit memory, a multi-level memory.

Furthermore, an apparatus for processing memory cells from a memory is disclosed, in which the apparatus has a processing unit configured to determine physical values from a number of n memory cells, wherein n is at least three, to at least partially compare the physical values with one another, to assign K different digital memory cell values to the n memory cells on the basis of the compared physical values, and to assign a code word of an n1-, . . . , nK-out-of-n code to the digital memory cell values obtained in this manner.

The processing unit mentioned here may be, in one embodiment, a processor unit and/or an at least partially a hard-wired or logical circuit arrangement which is configured, for example, such that the method described herein can be carried out. Said processing unit may be or comprise any type of processor or computer with accordingly required peripherals (memory, input/output interfaces, input/output devices, etc.).

The above explanations relating to the method accordingly apply to the apparatus. The apparatus may be designed in one component or may be distributed in a plurality of components.

A system is also disclosed and comprises at least one of the apparatuses described herein.

In one embodiment the processing unit is configured to at least partially compare the physical values with one another and thus to determine a sequence of the physical values, and to assign the K different digital memory cell values to the n memory cells on the basis of the sequence of the physical values.

A computer program product which can be directly loaded into a memory of a digital computer is also disclosed, and comprises program code parts which are suitable for carrying out acts of the method described herein.

A non-transitory computer-readable storage medium is disclosed, and comprises instructions which can be executed by a computer and which are suitable for the computer to carry out acts of the method described herein.

The above-described properties, features and advantages of this disclosure and the manner in which they are achieved are described below in connection with a schematic description of exemplary embodiments which are explained in more detail in connection with the drawings. In this case, identical or identically acting elements may be provided with identical reference symbols for clarity.

IN THE DRAWINGS

FIG. 2b shows a diagram having a plurality of times, wherein one time corresponds to one of the physical values illustrated in FIG. 2a;

DETAILED DESCRIPTION

Figure 1A:
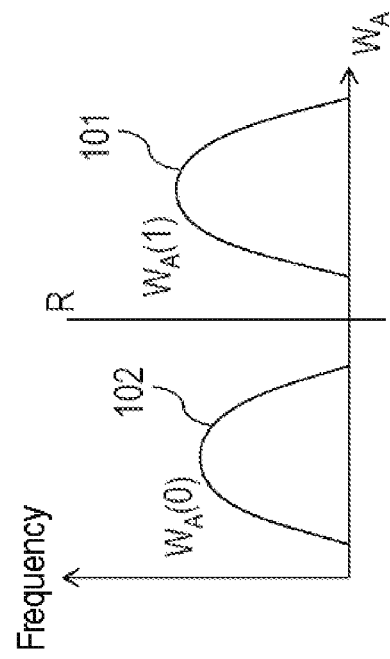
FIG. 1a shows a frequency distribution for physical values which have been read, wherein a reference value is illustrated between the frequency distributions.

A memory cell may assume different physical values or states which correspond to different digital values.

$W_G$ is used in one embodiment to denote a value of a physical variable G of a memory cell S and $W_D$ is used to denote a digital value of the memory cell S.

In one embodiment the digital value $W_D$ may be binary and may therefore assume one of two values which may be denoted 0 and 1. A digital value is, for example, one value from a finite number of values.

It is also possible in one embodiment for the digital value $W_D$ to assume more than two different values. For example, a digital value may assume three different values; in this case, these different digital values may be denoted 0, 1, 2. A digital value can generally assume K different values, with K≥2. These K different values can be denoted 0, 1, ..., K−1. A memory having memory cells which can store more than two digital memory cell values is also referred to here as a polyvalent memory or multi-level memory. The associated memory cells can be referred to as polyvalent or multi-level memory cells.

Accordingly, a memory having memory cells which store two digital values can be referred to as a binary memory and the corresponding memory cells can be referred to as binary memory cells.

In one embodiment a physical value read from the memory cell S is denoted $W_A$.

For example, the physical value or state of a memory cell may be an electrical resistance value. Accordingly, it is possible to distinguish between two resistance values in binary: for example, a larger resistance value may correspond to the digital value 0 and a smaller resistance value may correspond to the digital value 1. In another example, the larger resistance value can correspond to the digital value 1 and the smaller resistance value can correspond to the digital value 0.

If more than two digital values are stored in a memory cell, staggering (in the direction of the larger or smaller resistance values) can be accordingly carried out: for example, a largest resistance value can be assigned to the digital value 0, a second-largest resistance value can be assigned to the digital value 1, a third-largest resistance value can be assigned to the digital value 2, etc. and finally a smallest resistance value can be assigned to the digital value K−1 (in this case, K digital values can again be stored in the memory cell S).

In one embodiment, when reading a memory cell S, an analog physical value $W_A$ is determined, which value depends on the physical value $W_G$ generated when writing or storing the digital value $W_D$.

In the error-free case, the corresponding digital value $W_D$ can be determined from the physical value $W_A$ which has been read.

If different electrical resistance values correspond to different states of the memory cell S, as is the case with an MRAM for example, the stored physical value $W_G$ is a resistance value and the physical value $W_A$ which has been read may be a current or a voltage.

For example, when reading memory cells, it is possible to use at least one reference value R which is the same for all or a plurality of memory cells which have been read. Optionally, the (at least one) reference value can (also or partially) be externally provided. The value $W_A$ read from a memory cell can be compared with the reference value R.

The text below focuses, in particular, on binary memory cells, for example, which can store two different digital values 0 and 1. Accordingly, however, it is also possible to provide memory cells which can each store more than two digital values.

In one embodiment, if a larger resistance value corresponds to the binary value 0 and a smaller resistance value corresponds to the binary value 1, a smaller value $W_A$ of a current which has been read corresponds to the digital value 0 and a larger value $W_A$ of the current which has been read corresponds to the digital value 1.

Accordingly, it is an option in one embodiment that a voltage is determined as the value $W_A$ which has been read when reading a memory cell, the level of which voltage depends on whether the binary value 0 or the binary value 1 has previously been written to the memory cell.

In one embodiment, if the digital value $W_D$ is determined by comparing the value $W_A$ which has been read with a single corresponding reference value R, the following can apply to the digital value $W_D$:

$$W_D = \begin{cases} 0 & \text{for } W_A < R \\ 1 & \text{for } W_A > R \end{cases}$$

If a digital value 0 is written to a plurality of memory cells, the memory cells which have been written to assume different physical values $W_G$, which all correspond to the digital value $W_D$=0 in the error-free case and can be described by a frequency distribution, on account of statistical fluctuations (for example process fluctuations during manufacture), for example. Accordingly, the values $W_A$ which have been read also assume different values according to a frequency distribution.

This statement analogously applies to memory cells to which a digital value 1 or else a different value is written: if the digital value 1 is written to a plurality of memory cells, the memory cells which have been written to assume different physical values $W_G$, which all correspond to the digital value $W_D$=1 in the error-free case and can be described by a frequency distribution, on account of statistical fluctuations (for example process fluctuations during manufacture), for example. Accordingly, the values $W_A$ which have been read also assume different values according to a frequency distribution.

If it is possible to store more than one bit in a memory cell, these statements accordingly apply to all digital values which can be stored in each of the memory cells.

FIG. 1a shows, by way of example, a frequency distribution 101 for the values $W_A(1)$ which have been read and correspond to the digital value 1 and a frequency distribution 102 for the values $W_A(0)$ which have been read and correspond to the digital value 0. The different values $W_A$ which have been read are illustrated on the x axis and the frequencies of the values $W_A$ which have been read are illustrated on the y axis. A reference value R is also illustrated between the frequency distributions 101 and 102.

In the example illustrated in FIG. 1a, there is no overlap between the frequency distributions 101 and 102. Therefore, there is no incorrect assignment of the binary values 0 and 1. In other words, a unique and error-free assignment of the value $W_A$ which has been read to the respective binary value 0 or 1 is possible on the basis of the reference value R if a read error does not occur.

In this example, it is assumed in a simplified manner that no incorrect assignments occur either as a result of the effect of radiation or heating.

Figure 1B:
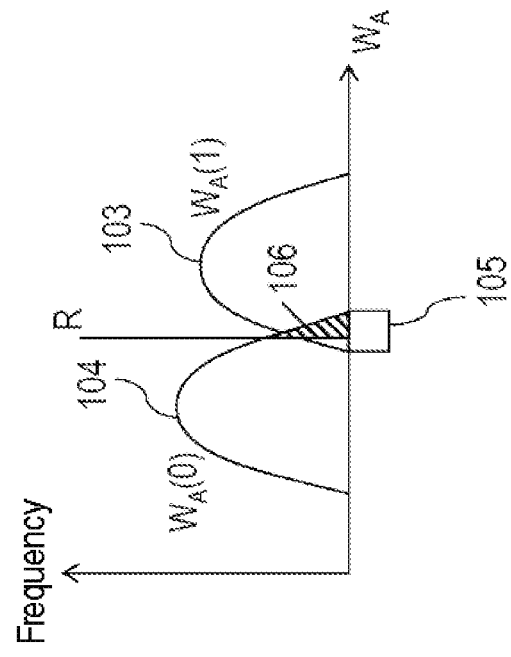
FIG. 1b shows a frequency distribution for physical values which have been read, wherein, in contrast to FIG. 1a, the frequency distributions overlap.

FIG. 1b shows, by way of example, a frequency distribution 103 for the values $W_A(1)$ which have been read and correspond to the digital value 1 and a frequency distribution 104 for the values $W_A(0)$ which have been read and correspond to the digital value 0. A reference value R is again illustrated between the frequency distributions 103 and 104.

In contrast to the frequency distributions 101 and 102 illustrated in FIG. 1a, the frequency distributions 103 and 104 overlap. Such an overlap can occur in MRAM memory cells, for example. FIG. 1b shows an overlap region 105; this is also denoted $[0, 1]_A$.

If the binary value 0 is assigned to a value $W_A$ which has been read, if $W_A<R$, and if the binary value 1 is assigned to the value $W_A$, if $W_A \geq R$, this assignment may be incorrect if the value $W_A$ which has been read is in the overlap region 105.

Errors based on an effect of radiation or heat or on permanent errors of memory cells may also occur.

An incorrect assignment may therefore be carried out with relevant probability on account of the overlap region 105 using the reference value R: if a value $W_A$ which has been read and corresponds to a binary value 0 is in the overlap region 105, $W_A>R$ may apply in approximately half of the cases, which results in an incorrect assignment. Accordingly: if a value $W_A$ which has been read and corresponds to a binary value 1 is in the overlap region 105, $W_A<R$ may apply in approximately half of the cases, which likewise results in an incorrect assignment.

Therefore, an associated digital value may be incorrectly assigned for values $W_A$ which have been read if they are in the overlap region 105. A region 106 shows a proportion of the values $W_A$ which have been read and are incorrectly assigned to the binary value 1 even though they are binary values 0. The frequency of an incorrect digital value being assigned is therefore substantially determined by the frequency of the value $W_A$ which has been read being in the overlap region 105. This is disadvantageous, in particular, for large overlap regions, as can occur in modern technologies, for example.

A digital binary value x which can assume the values 0 and 1 can be stored using two memory cells $S^1$ and $S^2$. For example, for x=0, a value 0 may be written (stored) to the memory cell $S^1$ and a value 1 may be written (stored) to the memory cell $S^2$ and, for x=1, a value 1 may be written (stored) to the memory cell $S^1$ and a value 0 may be written (stored) to the memory cell $S^2$. Conversely, for x=0, a value 1 can be accordingly written to the memory cell $S^1$ and a value 0 can be written to the memory cell $S^2$ and, for x=1, a value 0 can be written to the memory cell $S^1$ and a value 1 can be written to the memory cell $S^2$.

In one embodiment the (physical) values read from the two memory cells $S^1$ and $S^2$ can be compared with one another, for example by means of a comparator, in order to determine, in the error-free case, whether the value 0 or the value 1 has been stored.

For example, the physical value $W_A^1$ is read from the memory cell $S^1$ and the physical value $W_A^2$ is read from the memory cell $S^2$. If $$W_A^1 < W_A^2,$$

this may mean that the binary value x=0 has been stored in the two memory cells $S^1$ and $S^2$. If $$W_A^1 > W_A^2,$$

this may mean that the binary value x=1 has been stored in the two memory cells $S^1$ and $S^2$.

In this example, the values $W_A^1$ and $W_A^2$ which are stored in the memory cells $S^1$ and $S^2$ and have been read are compared with one another and are not compared with a reference value. This makes it possible to considerably reduce the probability of an error occurring as a result of the values which have been read being compared with one another.

An error can occur only if both the value $W_A^1$ of the cell $S^1$ which has been read and the value $W_A^2$ of the cell $S^2$ which has been read are in the overlap region of the distributions $W_A(0)$ and $W_A(1)$. This will be the case considerably more rarely than only one of the two values which have been read being in the overlap region.

If, in contrast, the value which has been read from a memory cell is compared with a reference value, an error can already occur when this one value which has been read is in the overlap region of the corresponding distributions.

In this case, it is disadvantageous that two memory cells are needed for each bit to be stored, that is to say 2·n memory cells are needed to store n bits.

One advantage of the examples presented here is that it is possible to store digital values with a high degree of reliability using as few memory cells as possible. Another advantage is that an error code can be additionally used during storage, with the result that read errors can be at least partially detected and/or corrected.

Transformation of Data Bits into Memory Cell Values

For example, in one embodiment $2^k$ possible assignments of k bits are transformed into n memory cell values. The memory cell values are stored in n memory cells, for example in memory cells of an addressable memory.

The n memory cell values stored in n memory cells can be read from the n memory cells and the n memory cell values which have been read can be transformed back into the k data bits if an error is not present.

The memory cell values may be binary values (for example the values 0 and 1). In this case, binary values are stored in the memory cells of the memory. These memory cells can then be referred to as binary memory cells.

It is also possible in one embodiment for each of the memory cell values to assume K different values. In contrast to the binary memory cell values, each memory cell value can assume more than two values here. The following therefore applies: K>2, wherein the K memory cell values are 0, 1, ..., K−1. If, for example, trivalent memory cells are provided and can accordingly store trivalent memory cell values, one of the values 0, 1 or 2 can be assigned to each memory cell value.

It is also possible in one embodiment for i memory cells to store different $K_i$-valent values (binary or polyvalent, that is to say $K_i \geq 2$). For example, at least two memory cells may be provided, one memory cell of which stores $K_1$-valent values and the other of which stores $K_2$-valent values, wherein $K_1 \neq K_2$.

Binary Memory Cell Values

The embodiment in which the memory cell values are binary is first of all considered.

k data bits $x_1, \ldots, x_k$ are intended to be transformed into n memory cell values $z_1, \ldots, z_n$ and stored in n memory cells.

The possible $2^k$ assignments of the k data bits $x_1, \ldots, x_k$ are transformed into memory cell values, for example by means of a combinational circuit (also referred to as a transformation circuit). For this purpose, the transformation circuit provides a transformation which maps the $2^k$ assignments of the k data bits to n memory cell values.

The transformation is implemented in such a manner that the memory cell values into which the data bits are transformed are code words of an $n_1$-out-of-n code. A code word of the $n_1$-out-of-n code has $n_1$ first binary values and $n_2 = n - n_1$ second binary values. If the first binary values have the value 1 and the second binary values have the value 0, a code word of the $n_1$-out-of-n code has a number of $n_1$ ones and a number of $n_2=n-n_1$ zeros.

It is accordingly possible for the first binary values to have the value 0 and for the second binary values to have the value 1.

The practice of storing the data bits as code words of the $n_1$-out-of-n code is advantageous since a higher degree of reliability can be achieved, for example, when reading the code words of the $n_1$-out-of-n code which are stored in the memory cells than in the case of data bits which are stored without coding.

The $n_1$-out-of-n code may also be referred to as an $n_1$-,$n_2$-out-of-n code, wherein $n_1$ denotes the number of first binary values and $n_2$ denotes the number of second binary values. In this case, $n_2=n-n_1$. It is clear from this designation that two different (here binary) values 0 and 1 are present in each code word.

The following apply:

$$n_1 < n$$

$$n_2 = n - n_1 < n$$

$$n_1 + n_2 = n$$

$$n_1 \geq 1$$

$$n_2 \geq 1.$$

For example, in one embodiment the number n of memory cell values may be greater than or equal to 3.

If the number of memory cell values is equal to 2 (that is to say n=2), the code words of the corresponding 1-out-of-2 code are 10 and 01. For example, the binary value 0 may be coded as 10 and the binary value 1 may be coded as 01. In this case, it is disadvantageous that n=2 memory cells are needed to store the information from an individual bit.

As explained above, there are $2^k$ different assignments of the k data bits. In addition, there are $$\binom{n}{n_1}$$

different code words of an $n_1$-out-of-n code.

In one embodiment the $2^k$ assignments of the k data bits can be transformed into the $$\binom{n}{n_1}$$

code words of the $n_1$-out-of-n code in a uniquely reversible manner, with the result that the corresponding assignment of the data bits can also be uniquely inferred on the basis of one of the code words if an assignment of the data bits is assigned to one of the code words.

There are at least as many different code words as assignments of the data bits, that is to say if the condition $$2^k \leq \binom{n}{n_1}$$

is satisfied, a reversibly unique transformation of all assignments of the k data bits into code words of the $n_1$-out-of-n code is possible.

It is also possible for not all of the $2^k$ possible assignments of the k data bits to occur, depending on the application. If this is the case and if a value $Anz < 2^k$ indicates the number of assignments which actually occur, it is only necessary for the condition $$Anz \leq \binom{n}{n_1}$$

to be satisfied in order to assign code words to the assignments which actually occur in a reversibly unique manner.

Therefore, fewer than 2·k memory cells can be advantageously used to store k data bits.

Binary Memory Cell Values: Examples

For example, k=4 data bits are assumed, for which there are $2^k = 2^4 = 16$ different assignments. If, for example, n=6 memory cells (n is the number of memory cell values, wherein each memory cell value is intended to be stored in one memory cell) are provided and if $n_1=3$, there are $$\binom{n}{n_1} = \binom{6}{3} = \frac{6 \cdot 5 \cdot 4}{3 \cdot 2 \cdot 1} = 20$$

different code words of a 3-out-of-6 code, wherein each of the code words has three ones and three zeros. It is therefore possible to transform the different 16 assignments of the 4 data bits into 16 selected code words (of the total of 20 code words) of the 3-out-of-6 code and to store them in 6 memory cells of the memory.

For n=6 memory cell values and $n_1=2$, only $$\binom{n}{n_1} = \binom{6}{2} = \frac{6 \cdot 5 \cdot 4}{2 \cdot 1} = 15$$

different code words of a 2-out-of-6 code would result, in which each code word has exactly two ones and four zeros. A reversibly unique transformation of the $2^4=16$ assignments of the 4 data bits into code words of the 2-out-of-6 code is therefore not possible.

If the value Anz of the assignments which have actually occurred is less than or equal to 15, for example, this 2-out-of-6 code can also be used.

Binary Memory Cell Values: Grouping of the Data Bits

It is explained below that N data bits are transformed into memory cell values, wherein N=M·k and M is greater than 1. Therefore, M groups of k data bits each can be formed, wherein the $2^k$ assignments of each group of k data bits are respectively transformed into $2^k$ code words of an $$\binom{n}{n_1}$$

code in a reversibly unique manner.

If the assignments of M groups of k data bits each are transformed into code words of an identical $n_1$-out-of-n code in each case, M·n memory cell values result and can be accordingly stored in M·n memory cells.

For example, an embodiment is described here in which the M groups each comprise k data bits. Alternatively, it is possible for a first group of data bits to have $k_1$ data bits, for a second group of data bits to have $k_2$ data bits, etc. to an Mth group having $k_m$ data bits. The number of data bits per group $k_1, k_2, \ldots, k_m$ may be at least partially different. Therefore $$N=k_1+k_2+\ldots+k_M,$$

Wherein the first $k_1$ data bits can be transformed into code words of a first $n_1^1$-out-of-$n^1$ code, the second $k_2$ data bits can be transformed into code words of a second $n_1^2$-out-of-$n^2$ code, the Mth $k_M$ data bits can be transformed into code words of an Mth $n_1^M$-out-of-$n^M$ code.

In this embodiment, the individual codes may at least partially differ from one another. Optionally, different codes may also be used when the number of data bits per group is the same.

If, for example, the number of data bits is k=3, $2^k$=8 possible assignments of the 3 data bits result. With n=5 memory cell values, both a 2-out-of-5 code and a 3-out-of-5 code can be used since these two codes each provide 10 code words and therefore more code words than possible assignments. For example, the 2-out-of-5 code can be thus used for a first group of 3 data bits and the 3-out-of-5 code can be used for a second group of 3 data bits.

As stated, it is an option in one embodiment for the groups of data bits to not all have the same number of k data bits. For example, 23 data bits are intended to be transformed into memory cell values: 5 groups with 4 data bits each and one group with 3 data bits can be formed from the 23 data bits. The $2^4$=16 possible assignments of the respective group with 4 data bits can be transformed, for example, into code words of a 3-out-of-6 code which has 20 different code words. The remaining group with 3 data bits has $2^3$=8 possible assignments. These 3 data bits can be transformed, for example, into code words of a 3-out-of-5 code which has 10 code words. As a result, one memory cell less is required than if the $2^3$=8 possible assignments of the 3 data bits were also transformed into code words of the 3-out-of-6 code. It is also possible, for example, in one embodiment to supplement the group of 3 data bits with a constant bit, for example a bit having the value 0, thus resulting in 4 data bits, with the result that all groups have the same number of data bits and the same transformation can therefore be used. This makes it possible to reduce the outlay when designing the circuit.

Polyvalent Memory Cell Values

The embodiment in which memory cell values can assume more than two different values and the memory cells can accordingly store polyvalent memory cell values shall now be considered.

In one embodiment, a memory cell is intended to be able to store K different memory cell values, wherein K>2 (K=2 would be the special case of the binary memory cell values). The different memory cell values for each memory cell can be denoted $0, 1, \ldots, K-1$.

k data bits are intended to be stored again. The $2^k$ different assignments of the k data bits can be transformed into n memory cell values in a reversibly unique manner. These n memory cell values have
$n_1$ first values,
$n_2$ second values,
$n_K$ Kth values.
For example,
the first values can be denoted 0,
the second values can be denoted 1,
the Kth values can be denoted K−1.

The n memory cell values can also be referred to as an n-tuple of memory cell values. The n-tuple of n polyvalent (here K-valent) memory cell values, which have $n_1$ first values, $n_2$ second values, $\ldots$, $n_K$ Kth values, can be referred to as a code word of an $n_1$-,$n_2$-, $\ldots$ ,$n_K$-out-of-$n$ code.

The $n_1$-,$n_2$-, $\ldots$, $n_K$-out-of-n code has the following number of code words:

$$\binom{n}{n_1} \cdot \binom{n-n_1}{n_2} \cdot \ldots \cdot \binom{n-n_1-n_2-\ldots-n_{K-1}}{n_K}.$$

The $2^k$ assignments of the k data bits are now intended to be transformed into $2^k$ of these code words of the $n_1$-,$n_2$-, $\ldots$, $n_K$-out-of-n code in a reversibly unique manner. This is possible if the condition $$2^k \leq \binom{n}{n_1} \cdot \binom{n-n_1}{n_2} \cdot \ldots \cdot \binom{n-n_1-n_2-\ldots-n_{K-1}}{n_K}$$

or if the condition $$Anz \leq \binom{n}{n_1} \cdot \binom{n-n_1}{n_2} \cdot \ldots \cdot \binom{n-n_1-n_2-\ldots-n_{K-1}}{n_K}$$

is satisfied provided that the value Anz (with Anz<$2^k$) is the number of assignments of the k bits which actually occur, as was described above with respect to the binary memory cell values.

Polyvalent Memory Cell Values: Examples

In one embodiment the intention is to store k=6 data bits. Therefore, there are $2^k=2^6$=64 possible assignments of the 6 data bits. As described, the data bits are binary values and are subjected to a transformation in advance for storage in the polyvalent memory cells.

For example, trivalent memory cell values (K=3) are considered. Each memory cell can therefore store three different values. Overall, there are n=6 memory cell values (and therefore 6 memory cells) and $n_1=n_2=n_3=2$ is assumed. There are therefore $$\binom{6}{2} \cdot \binom{4}{2} \cdot \binom{2}{2} = 90$$

different code words of the 2-,2-,2-out-of-6 code used here by way of example. These 90 code words suffice to map the $2^6$=64 possible assignments of the 6 data bits.

The polyvalent memory cells allow more efficient use in comparison with the binary memory cells since more than two values can be stored for each memory cell. Therefore, a small quantity of physical memory cells suffices: in the present example, 90 code words of the 2-,2-,2-out-of-6 code can be formed using only 6 trivalent memory cells, whereas only 20 code words of a 3-out-of-6 code can be formed using 6 binary memory cells.

One of the values 0, 1 and 2 occurs twice in each code word of the 2-,2-,2-out-of-6 code assumed here by way of example. Examples of code words are: 001122, 101220, 021210.

In another example, a 1-,1-,1-out-of-3 code is used for trivalent memory cell values (K=3). For n=3 memory cells, this code has $$\binom{3}{1} \cdot \binom{2}{1} \cdot \binom{1}{1} = 6$$

code words 012, 021, 102, 120, 201 and 210. If the intention is to store k=2 data bits, $2^2=4$ different assignments can be stored in the 3 memory cells as code words of the 1-,1-,1-out-of-3 code.

In a further example, tetravalent memory cell values K=4 are considered. Each memory cell can store, for example, one of the values 0, 1, 2 or 3. Overall, there are n=6 memory cells in this example and $n_1=n_2=2$ and $n_3=n_4=1$ are assumed. Therefore, there are $$\binom{6}{2} \cdot \binom{4}{2} \cdot \binom{2}{1} \cdot \binom{1}{1} = 15 \cdot 6 \cdot 2 \cdot 1 = 180$$

different code words of a 2-,2-,1-,1-out-of-6 code. These 180 code words can be used to store 7 data bits with $2^7=128$ possible assignments in the 6 tetravalent memory cells.

Examples of code words of the 2-,2-,1-,1-out-of-6 code used here are: 001123, 101320, 031210. Each of the code words respectively has two zeros, two ones, one two and one three.

Polyvalent Memory Cell Values: Grouping of the Data Bits

The embodiment in which N data bits are transformed into memory cell values is considered again, wherein N=M·k and M is greater than 1. M groups of k data bits each can therefore be formed, wherein the $2^k$ assignments of each group of k data bits are each transformed into $2^k$ code words of an $n_1$-,$n_2$-, ..., $n_K$-out-of-n code in a reversibly unique manner.

If the assignments of M groups of k data bits each are transformed into code words of the $n_1$-,$n_2$-, ..., $n_K$-out-of-n code, M·n K-valent memory cell values result and are accordingly stored in M·n K-valent memory cells.

It may be advantageous in one embodiment to transform the assignments of all groups of k data bits into memory cell values using the same transformation. A transformation circuit can then be used repeatedly, for example. However, it is also possible in one embodiment to transform the k data bits in the various groups into memory cell values using different transformations.

Writing and Reading Data Bits

The k bits to be stored are also referred to as data bits. These data bits may have, for example, information bits and check bits of a separable error-detecting and/or error-correcting code. In this case, information bits may be supplemented with check bits in a separable code. It is also possible in one embodiment for the data bits to be bits of an inseparable code in which the bits of a code word are not subdivided into information bits and check bits. It is also an option for the data bits to comprise information bits and address bits and/or bits derived from address bits and/or bits of a password.

The designation "data bits" is used, for example, to denote the bits to be stored in the memory. These may be program code, image data, measurement data or other useful data (payload) which are transformed into memory cell values and stored in memory cells. The memory cell values may be polyvalent or binary in this embodiment.

In one embodiment, when reading the memory cells, the digital memory cell values stored in the memory cells are determined by comparing physical values output from the n memory cells. Alternatively, they may also be values which are derived from the physical values which have been output.

If the n memory cells are binary, the sequence of k bits to be stored is transformed into a sequence of n binary memory cell values which has $n_1$ first binary values and $n_2$ second binary values. If the first binary values are denoted 1 and the second binary values are denoted 0, a sequence of k bits to be stored is transformed into a code word of an $n_1$-out-of-n code and $n_2=n-n_1$.

With a given n and $n_1$, k is determined such that $$2^k \leq \binom{n}{n_1}.$$

If the memory cells are not binary and a memory cell is used to store K-valent digital memory cell values, a sequence of k bits is transformed into a sequence of n K-valent memory cell values which are stored in the n memory cells. The sequence of n memory cell values is determined such that it has a predetermined first number $n_1$ of first memory cell values which are identical to one another, a predetermined second number $n_2$ of second memory cell values which are identical to one another, etc. up to a predetermined Kth number $n_K$ of Kth memory cell values which are identical to one another.

In this embodiment, $$1 \leq n_1, 1 \leq n_2, \ldots, 1 \leq n_K$$

and $$n_1 + n_2 + \ldots + n_K = n.$$

Furthermore, k is determined such that $$2^k \leq \binom{n}{n_1} \cdot \binom{n-n_1}{n_2} \cdot \ldots \cdot \binom{n-n_1-\ldots-n_{K-1}}{n_K}.$$

A sequence of n K-valent memory cell values having a predetermined first number $n_1$ of first memory cell values identical to one another, a predetermined second number $n_2$ of second memory cell values identical to one another, etc. up to a predetermined Kth number $n_K$ of Kth memory cell values identical to one another can be referred to as a code word of an ($n_1$-,$n_2$-, ..., $n_K$-out-of-n) code.

The number $n_K$ of Kth memory cell values identical to one another is determined as $$n_K = n - n_1 - n_2 - \ldots - n_{K-1}.$$

In one embodiment, when reading the memory cells, the digital data stored in the memory cells of a group of n memory cells are determined by comparing physical values read from memory cells of the group. Alternatively, the digital data stored in the memory cells of a group of n memory cells are determined by means of a comparison using physical values which have been read or derived properties.

A temporal behavior of physical values read from different memory cells can also be considered as a property and can be (concomitantly) taken into account for a comparison.

At a time T, a value read from a memory cell $S^i$ assumes an analog value $W_A^i(\tau)$. For example, the value $W_G^i$ stored in the memory cell $S^i$ is an electrical resistance value and the physical value $W_A^i(\tau)$ obtained from the memory cell $S^i$ at the time $\tau$ is a read current (a current intensity).

If the resistance $W_G^i$ of the memory cell $S^i$ is less than a resistance value $W_G^j$ of another memory cell $S^j$, the read current $W_A^i(\tau)$ is greater than a read current $W_A^j(\tau)$ of the other memory cell S provided that a predefined (identical) read voltage is used to read both memory cells.

If the read current $W_A^i(\tau)$ of the memory cell $S^i$ is integrated over time using a capacitance C, a predefined threshold value Sw is reached at a time $t_i$. The physical value obtained from the memory cell $S^i$ is the read current $W_A^i$ here, for example. The derived value determined from the physical value which has been read is, for example, the time $t_i$ at which the time integral of the read current reaches the predefined threshold value Sw.

If the read current $W_A^j(\tau)$ of the memory cell $S^j$ is integrated over time using the capacitance C, the predefined threshold value Sw is reached at a time $t_j$.

Since the following applies to the read currents of the memory cells $S^i$ and $S^j$ $$W_A^i(\tau) > W_A^j(\tau),$$

$t_i < t_j$ also applies and the threshold value Sw is reached earlier for the memory cell $S^i$ than for the memory cell $S^j$.

For the memory cells $S^i$ and $S^j$, it is therefore possible to compare whether the integral of the read current of the memory cell $S^i$ reaches the threshold value Sw earlier than the integral of the read current of the memory cell $S^j$. This is the case when (with the same voltage) the resistance value $W_G^i$ is less than the resistance value $W_G^j$.

It is therefore an option in one embodiment to determine an order (or "sequence") of the memory cells $S^i$ and $S^j$ on the basis of the physical values $W_G^i$ and $W_G^j$ stored in them or their states. By means of the times $t_i$ and $t_j$ at which the threshold value Sw is reached, the memory cells can be sorted according to their resistances $W_G^i$ and $W_G^j$, that is to say first the memory cell $S^i$, then the memory cell $S^j$ (or vice versa).

This approach can be used to sort all memory cells of a group of n memory cells.

If, for example, a binary zero is written to first $n_1$ memory cells and a binary 1 is written to second $n_2$ memory cells, the electrical resistance of the first $n_1$ memory cells is less than the electrical resistance of the second $n_2$ memory cells in the error-free case, with the result that the read current of the first $n_1$ memory cells is greater than the read current of the second $n_2$ memory cells. For example, the following applies in this case: $n_1 + n_2 = n$.

Accordingly, the times $t_1^1, t_2^1, \ldots, t_{n1}^1$ at which the threshold value Sw is reached for the first $n_1$ memory cells are before the times $t_1^2, t_2^2, \ldots, t_{n2}^2$ at which the threshold value Sw is reached for the second $n_2$ memory cells.

The memory cells can therefore, in one embodiment, be ordered according to the times at which the threshold value Sw is reached. For example, the first memory cell can be assigned to the earliest (first) time and the nth memory cell can be assigned to the latest (last) time. In this example, the first $n_1$ memory cells would then be precisely those memory cells to which a binary value 0 has been written, and the $n_2$ remaining memory cells would be those memory cells to which a binary value 1 has been written.

For example, the integral $$v^i(t) = \frac{1}{C} \int_0^t W_A^i d\tau = \frac{t}{C} \cdot W_A^i$$

indicates a voltage $v^i(t)$ at a time t on the basis of the respective read currents $W_A^i$ (with $i=1, \ldots, n$) for the n memory cells $S^1$ to $S^n$.

This voltage $v^i(t)$ can be compared with the threshold value Sw. It is therefore possible to determine the times at which the above integral reaches the threshold value Sw. The times obtained can be compared with one another. It is therefore possible to determine whether the state of the memory cell corresponds to a binary value 0 or 1.

The time $t_i$ can be determined by virtue of the following applying $$v^i(t) < Sw \text{ for } t < t_i$$

and $$v^i(t) > Sw \text{ for } t > t_i,$$

wherein the read current is assumed to be constant over time in this case, for example.

The resistance values or the states of the memory cells can be compared with one another using the read current or the time integral of the read current. Fluctuations in the resistance values inside the first $n_1$ cells advantageously do not affect the assignment of the binary value 0 to these memory cells as long as these resistance values are not greater than a resistance value of the second $n_2$ memory cells. Accordingly, fluctuations in the resistance values inside the second $n_2$ cells advantageously do not affect the assignment of the binary value 1 to these memory cells as long as their resistance values are not less than a resistance value of the first $n_1$ memory cells.

Subgroups of Memory Cells

For example, in one embodiment it may also not be necessary to determine a sequence of the $n_1$ memory cells having identical first digital values or a sequence of the $n_2$ memory cells having identical second digital values of a group of n memory cells. The $n_1$ memory cells having the first digital values form a first subgroup and the $n_2$ memory cells having the second digital values form a second subgroup. Each of the subgroups corresponds to a part of the group of n memory cells. An example of such subgroups is explained in more detail below.

For example, 2 subgroups are considered, wherein the following applies to the number of memory cells $n_1$ and $n_2$ in the subgroups:

$$n_1 + n_2 = n.$$

A first digital value is respectively written to the $n_1$ memory cells in the first subgroup and a second digital value, which differs from the first digital value, is respectively written to the $n_2$ memory cells in the second subgroup.

In one embodiment, when reading the physical values from the memory cells, it may be advantageous not to determine a sequence between the $n_1$ memory cells in the first subgroup since the same digital value has been written to them.

For example, $n=6$ memory cells $S^1, \ldots, S^6$ are considered. The memory cells $S^1, S^2, S^3$ are the $n_1=3$ memory cells in the first subgroup and the memory cells $S^4, S^5, S^6$ are the $n_2=3$ memory cells in the second subgroup. The value 0 is written to the memory cells in the first subgroup and the value 1 is written to the memory cells in the second subgroup.

Figure 2A:
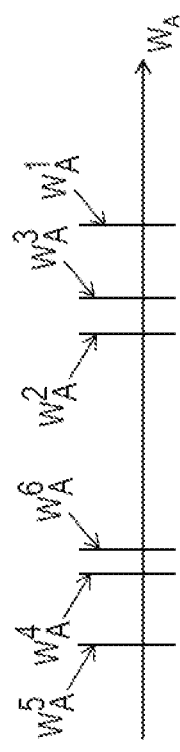
FIG. 2a shows a diagram comprising a plurality of physical values which have been read from the memory cells.

FIG. 2a shows a diagram comprising a plurality of physical values $W_A^1$, $W_A^2$, $W_A^3$, $W_A^4$, $W_A^5$ and $W_A^6$ which have been read from the memory cells $S^1$ to $S^6$. The physical value $W_A$ is a read current, for example.

Figure 2B:
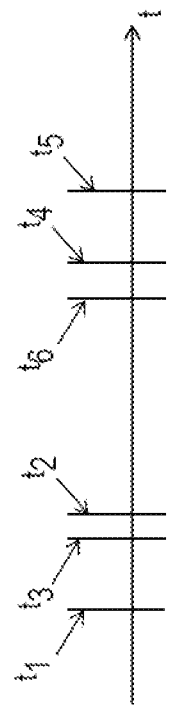

FIG. 2b shows a diagram having a plurality of times $t_1$ to $t_6$, wherein one time $t_m$ corresponds to one of the physical values $W_A^m$, with m=1, ..., 6.

Integration of the corresponding read currents over time therefore makes it possible to determine times $t_1$, $t_2$, $t_3$, $t_4$, $t_5$ and $t_6$ at which the time integral of the respective read current reaches a predefined threshold value. For example, the following applies according to FIG. 2b:

$$t_5 > t_4 > t_6 > t_2 > t_3 > t_1.$$

The digital values 0 or 1 stored in the memory cells $S^1$ to $S^6$ can be assigned by determining that $$t_i > t_j$$

for i=4, 5, 6 and for j=1, 2, 3. In particular, it is advantageous that there is no need to determine a difference between the times $t_4$, $t_5$, $t_6$ and the times $t_1$, $t_2$, $t_3$.

It is therefore possible in one embodiment to allocate a first digital value to the $n_1$ first memory cells, the time integral of the read current of which reaches the threshold value Sw, and to allocate a second digital value to the $n_2$ remaining memory cells. In this case, it may suffice to determine whether one of the memory cells belongs to the $n_1$ first memory cells.

It is also possible in one embodiment to combine analog signals from memory cells and, on the basis of these combinations, to determine whether a first digital value or another digital value is assigned to memory cells.

For a group of n memory cells and $n_1$ first memory cells, $$\binom{n}{n_1}$$

different possible ways of writing $n_1$ zeros and $n_2 = n - n_1$ ones to the n memory cells result. Therefore, $$\binom{n}{n_1}$$

different assignments (also referred to as states) are possible in the n memory cells, with the result that k data bits (also referred to as a k-bit byte) can be stored in the n memory cells if $$2^k \leq \binom{n}{n_1}.$$

If n is an even number, the greatest number of possible states results for $n_1 = n/2$.

For example, there are n=6 memory cells each with $n_1 = n_2 = 3$ first and second memory cells. The n=6 memory cells form a group of memory cells $S_1$ to $S_6$ in which a code word of a 3-out-of-6 code can be stored.

The embodiment in which an error does not occur is intended to be described first. When reading the memory cells, the times $t_1$ to $t_6$ at which the value of the integral of the read currents $W_A^1(\tau)$ to $W_A^6(\tau)$ reaches the threshold value Sw are compared.

If, for example, $$t_1 < t_3 < t_4 < t_2 < t_5 < t_6,$$

the sequence of the memory cells is $$S_1, S_3, S_4, S_2, S_5, S_6.$$

The code word 101100 of the 3-out-of-6 code is stored in the memory cells $S_1$ to $S_6$, for example, and is read from these memory cells. The value 1 is determined, as the value which has been read, for the first three memory cells $S_1$, $S_3$ and $S_4$ of the ordered memory cells and the value 0 is determined, as the value which has been read, for the following three memory cells $S_2$, $S_5$ and $S_6$ of the ordered memory cells.

If, in contrast, $$t'_3 < t'_4 < t'_1 < t'_2 < t'_6 < t'_5,$$

for example, the sequence of the memory cells follows from this as $$S_3, S_4, S_1, S_2, S_6, S_5.$$

The same code word 101100 of the 3-out-of-6 code is therefore read from the memory cells $S_1$ to $S_6$. A transposition of the sequence inside the memory cells $S_1$, $S_3$ and $S_4$ which store the binary value 1 or a transposition of the sequence inside the memory cells $S_2$, $S_5$ and $S_6$ which store the binary value 0 does not affect the read code word of the 3-out-of-6 code.

This property is advantageous since minor fluctuations in the physical values which have been read and correspond to the same digital values do not affect the associated digital values during reading.

In this example, the memory cells $S_1$, $S_3$ and $S_4$ are provided for the purpose of storing the value 1. The values $W_G^1$, $W_G^3$, $W_G^4$ which are each intended to represent the binary value 1 have been written to these memory cells. These values $W_G^1$, $W_G^3$, $W_G^4$ differ little from one another, but may vary slightly, in particular as a result of random influences.

Accordingly, the memory cells $S_2$, $S_5$ and $S_6$ are provided for the purpose of storing the value 0. The values $W_G^2$, $W_G^5$ and $W_G^6$ which each represent the binary value 0 have been written to these memory cells. These values $W_G^2$, $W_G^5$ and $W_G^6$ differ little from one another, but may likewise vary slightly on account of random influences.

If, for example instead of $$t_1 < t_3 < t_4 < t_2 < t_5 < t_6,$$

a temporal order $$t'_1 < t'_3 < t_2 < t'_4 < t'_5 < t'_6$$

has been determined, the memory cells are ordered as follows $$S_1, S_3, S_2, S_4, S_5, S_6$$

and the code word 111000 of the 3-out-of-6 code is read from the memory cells $S_1$ to $S_6$, which code word differs from the error-free code word 101100 by virtue of the fact that the temporally first memory cell $S_2$, which is assigned the value 0 in the sequence of the memory cells in the error-free case, and the temporally last memory cell $S_4$, which is assigned the value 1 in the sequence of the memory cells in the error-free case, are transposed.

Example: Trivalent Memory Cells

A scenario according to one embodiment is considered by way of example below, in which three different digital values 0, 1 and 2 can be stored for each memory cell.

Figure 3:
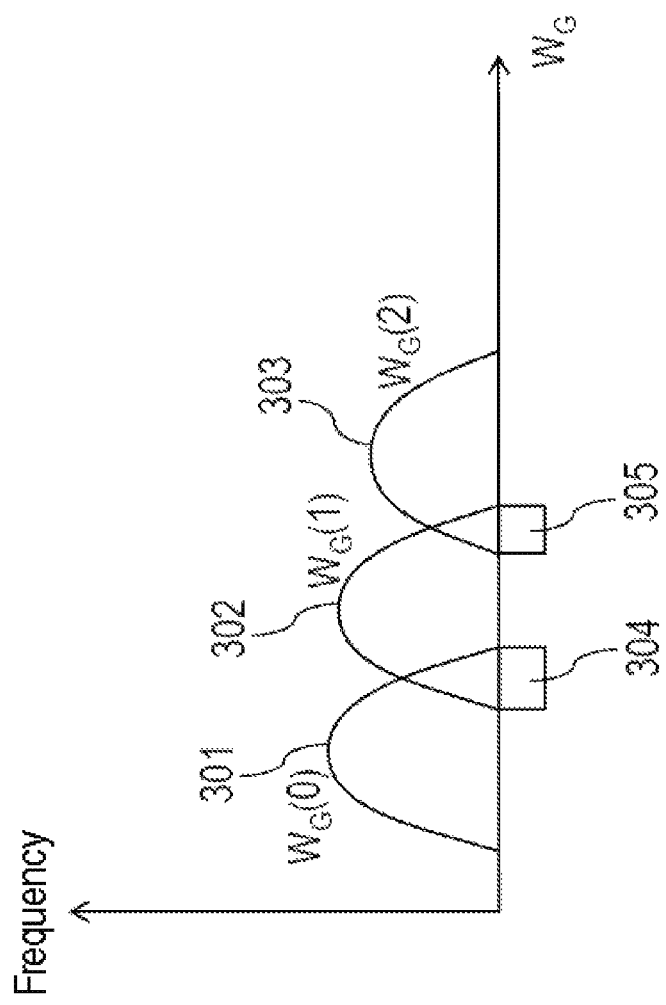
FIG. 3 shows a graph which illustrates the frequency distributions of physical values $W_G$ of a memory cell.

FIG. 3 shows a graph which illustrates frequency distributions of physical values $W_G$ of a memory cell.

FIG. 3 shows a frequency distribution 301 for stored values 0, a frequency distribution 302 for stored values 1 and a frequency distribution 303 for stored values 2. The frequency distribution 301 is also denoted $W_G(0)$, the frequency distribution 302 is also denoted $W_G(1)$ and the frequency distribution 303 is also denoted $W_G(2)$.

The frequency distributions 301 and 302 have an overlap region 304 and the frequency distributions 302 and 303 have an overlap region 305.

According to one embodiment, the physical value may be a resistance value.

Figure 4:
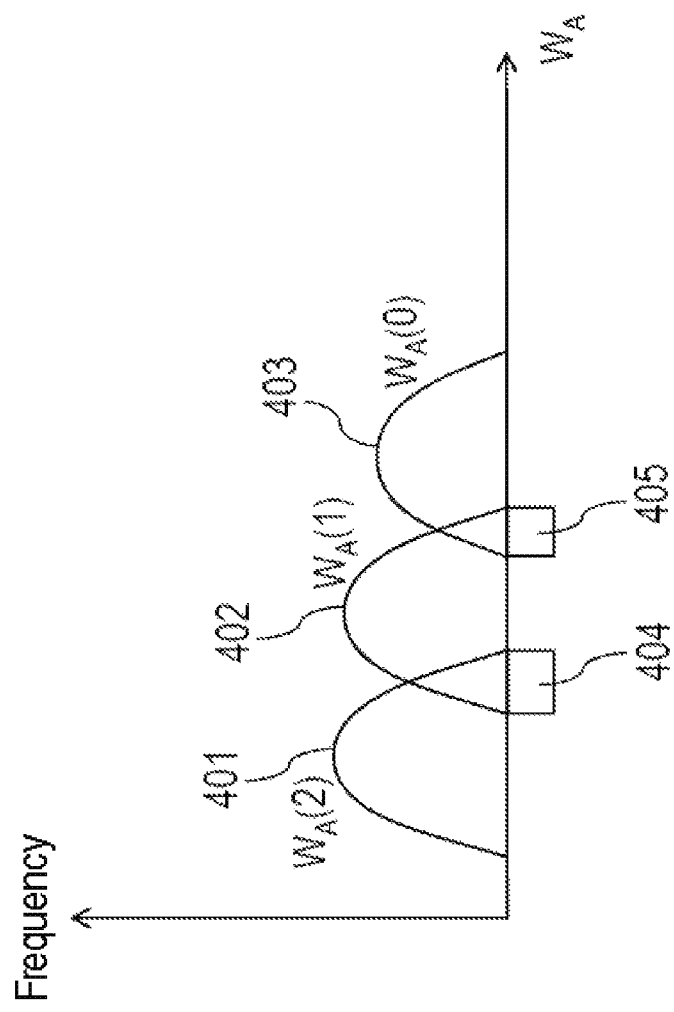
FIG. 4 shows a graph which illustrates frequency distributions of values read from the memory.

FIG. 4 shows, by way of example, a frequency distribution 401 for the values 2 read from the memory, a frequency distribution 402 for the values 1 read from the memory and a frequency distribution 403 for the values 0 read from the memory. The frequency distribution 401 is also denoted $W_A(2)$, the frequency distribution 402 is also denoted $W_A(1)$ and the frequency distribution 403 is also denoted $W_A(0)$.

The frequency distributions 401 and 402 have an overlap region 404 and the frequency distributions 402 and 403 have an overlap region 405.

According to one embodiment, the physical value which has been read may be a current intensity.

If a current intensity $W_A^i(\tau)$ of the read current of the memory cell $S^i$ is integrated over time t, a predefined threshold value Sw is reached at a time $t_i$.

If a current intensity $W_A^j(\tau)$ of the read current of the memory cell $S^j$ is integrated over time t, the predefined threshold value Sw is reached at a time $t_j$.

If the digital value 2 is written to the memory cell $S^i$, the memory cell $S^i$ has a relatively large resistance value ($W_G^i$) and the read current $W_A^i$ is relatively low when reading this memory cell $S^i$. Accordingly, the time $t_i$ at which the time integral of the read current reaches the predefined threshold value Sw is large.

If the digital value 1 is written to the memory cell $S^j$, the memory cell $S^j$ has a resistance value $W_G^j$ which is lower than the resistance value $W_G^i$ of the memory cell $S^i$. Accordingly, the read current $W_A^j$ when reading the memory cell $S^j$ is greater than the read current $W_A^i$ when reading the memory cell $S^i$. Therefore, the time $t_j$ at which the time integral of the read current reaches the predefined threshold value Sw is before the time $t_i$, that is to say $t_j < t_i$.

If the digital value 0 is written to the memory cell $S^k$, the memory cell $S^k$ has a resistance value $W_G^k$ which is both lower than the resistance value $W_G^i$ of the memory cell $S^i$ and lower than the resistance value $W_G^j$ of the memory cell $S^j$. Accordingly, the read current $W_A^k$ of the memory cell $S^k$ is greater than the read current $W_A^j$ of the memory cell $S^j$ or the read current $W_A^i$ of the memory cell $S^i$. Therefore, the time $t_k$ at which the time integral of the read current reaches the predefined threshold value Sw is before the times $t_i$ and $t_j$, that is to say $t_k < t_j < t_i$.

If the same digital value as that written to a memory cell $S^j$ has been written to a memory cell $S^i$, the resistance value $W_G^i$ of the memory cell $S^i$ may be greater or less than the resistance value $W_G^j$ of the memory cell $S^j$.

It is likewise possible in one embodiment for the read current $W_A^i$ of the memory cell $S^i$ to be greater or less than the read current $W_A^j$ of the memory cell $S^j$.

It is also possible in one embodiment for the time $t_i$ at which the time integral of the read current of the memory cell $S^i$ reaches the predefined threshold value Sw to be before or after the time $t_j$ at which the time integral of the read current of the memory cell $S^j$ reaches the predefined threshold value Sw.

In this embodiment, it therefore remains undetermined whether $t_i < t_j$ or $t_i > t_j$. The value "undetermined" is also described here by the symbol "-".

Example

A group of n=6 memory cells $S^1$ to $S^6$ is considered by way of example. In this case, there are three subgroups each with two memory cells, that is to say $n_1 = n_2 = n_3 = 2$, wherein the digital memory cell value 2 is stored in $n_1 = 2$ first memory cells, the digital memory cell value 1 is stored in $n_2 = 2$ second memory cells, and the digital memory cell value 0 is stored in $n_3 = 2$ third memory cells. There are therefore $$\binom{n}{n_1} \cdot \binom{n-n_1}{n_2} \cdot \binom{n-n_1-n_2}{n_3} = \binom{6}{2} \cdot \binom{4}{2} \cdot \binom{2}{2} = 15 \cdot 6 \cdot 1 = 90$$

possible ways of distributing two twos, two ones and two zeros to 6 positions and storing them in 6 memory cells having three digital (ternary) memory cell values.

In contrast to this, for n=6 and $n_1 = n_2 = 3$, there are only $$\binom{n}{n_1} \cdot \binom{n-n_1}{n_2} = \binom{6}{3} \cdot \binom{3}{3} = 20$$

possible ways of distributing three ones and three zeros to 6 positions and storing them in 6 memory cells having binary memory cell values, with the result that considerably more information can be stored in a group of n memory cells by using the three ternary digital values 0, 1 and 2 than by using only binary memory cell values 0 and 1.

In this example in which each of the memory cells can assume the value 0, 1 or 2, a number of k=6 data bits (with $2^6 = 64$ possible assignments) can therefore be transformed into n=6 digital memory cell values and stored in n=6 memory cells. The 6 memory cell values each have $n_1 = 2$ first digital values 2, $n_2 = 2$ second digital values 1, and $n_3 = 2$ third digital values 0.

The 6 memory cell values form a code word of a

2-,2-,2-out-of-6 code in which each code word has two first digital values, two second digital values and two third digital values.

The code has $$\binom{n}{n_1} \cdot \binom{n-n_1}{n_2} \cdot \binom{n-n_1-n_2}{n_3} = 15 \cdot 6 \cdot 1 = 90$$

code words.

With k=6 bits, $2^k = 2^6 = 64$ binary words having a length of 6 can be transformed into 64 of the code words of the 2-,2-,2-out-of-n code in a reversibly unique manner.

Figure 15:
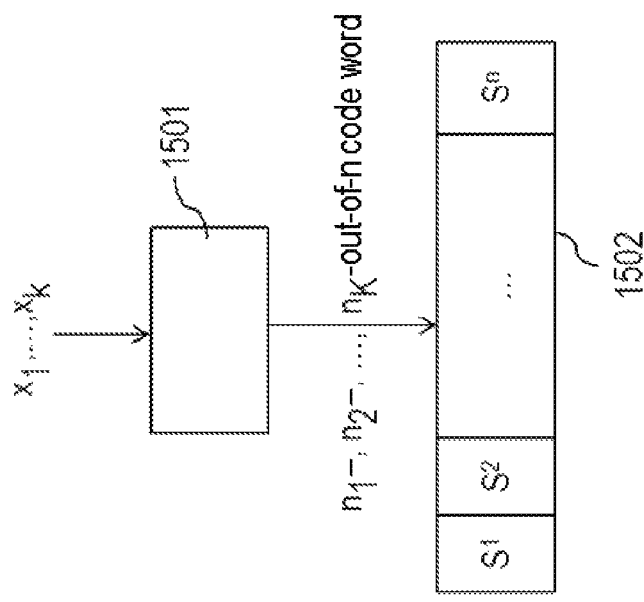
FIG. 15 shows a schematic arrangement for illustrating how data bits are transformed by means of a transformation circuit and are stored as memory cell values in memory cells of a memory.

FIG. 15 shows according to one embodiment a schematic arrangement for illustrating how k data bits $x_1$ to $x_k$ are transformed by means of a transformation circuit 1501 and are stored as n memory cell values in n memory cells of a memory 1502. In this case, $k \geq 2$ and $n \geq 3$ are assumed by way of example. The k data bits $x_1$ to $x_k$ are present at the input of the transformation circuit 1501.

The n memory cell values are provided at data inputs of the memory cells of the memory 1502 by the transformation circuit 1501. These n memory cell values form a code word of an $n_1$-,$n_2$-, . . . ,$n_K$-out-of-n code.

The memory cell values are K-valent digital values for example.

Figure 16:
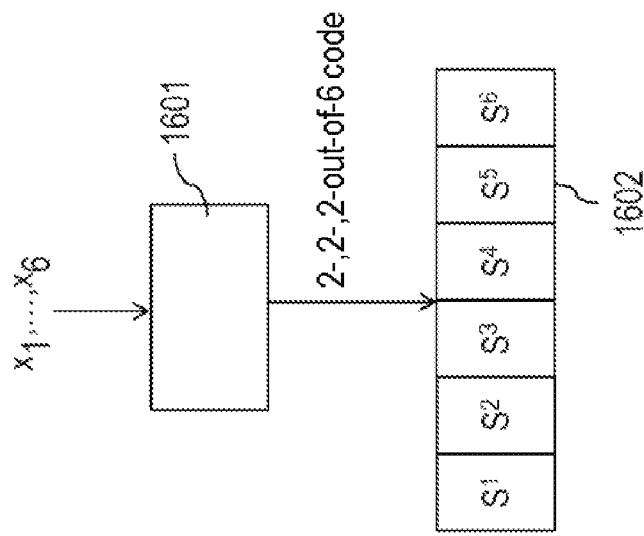
FIG. 16 shows a schematic implementation of the arrangement from FIG. 15, wherein n=k=6, K=3 and $n_1=n_2=n_3=2$, for example, in FIG. 16.

FIG. 16 shows a schematic implementation of the embodiment from FIG. 15, wherein n=k=6, K=3 and $n_1$=$n_2$=$n_3$=2, for example, in FIG. 16. According to the example shown in FIG. 16, 6 data bits $x_1$ to $x_6$ are transformed into 6 trivalent memory cell values by means of a transformation circuit 1601 and are stored in a memory 1602. The 6 memory cell values have two values 2, two values 1 and two values 0 and form (in the error-free case) a code word of a 2-,2-,2-out-of-6 code. In this case, each of the memory cells is able to store trivalent (K=3) memory cell values.

As described, the times $t_1$ to $t_6$ at which the time integral of the read current reaches (or exceeds) the predefined threshold value Sw are determined for the memory cells $S^1$ to $S^6$ during reading. If, for example, $t_{i1} < t_{i2} < t_{i3} < t_{i4} < t_{i5} < t_{i6}$, the memory cells $S^1$ to $S^6$ can be ordered in the sequence $S^{i1}, S^{i2}, S^{i3}, S^{i4}, S^{i5}, S^{i6}$.

In this case, the set of values $i_1, \ldots, i_6$ is equal to the set of values 1, . . . , 6. If, for example, $i_1$=5, $i_2$=4, $i_3$=2, $i_4$=1, $i_5$=6 and $i_6$=3, $t_5 < t_4 < t_2 < t_1 < t_6 < t_3$ results and the sequence of the memory cells is therefore $S^5, S^4, S^2, S^1, S^6, S^3$.

It can be stipulated in one embodiment that the digital memory cell value 0 is assigned to the first two memory cells $S^{i1}$ and $S^{i2}$ in the sequence of memory cells, the digital memory cell value 1 is assigned to the following two memory cells $S^{i3}$ and $S^{i4}$ in the sequence and the digital memory cell value 2 is assigned to the further two memory cells $S^{i5}$ and $S^{i6}$ in the sequence.

It can also be stipulated in one embodiment that the digital memory cell value 2 is assigned to the first two memory cells $S^{i1}$ and $S^{i2}$, the digital memory cell value 1 is assigned to the following two memory cells $S^{i3}$ and $S^{i4}$ and the digital memory cell value 0 is assigned to the further two memory cells $S^{i5}$ and $S^{i6}$. Accordingly, further assignment variants are also possible.

Digital values are incorrectly assigned only
if both the read current $W_A^{i2}$ of the memory cell $S^{i2}$ and the read current $W_A^{i3}$ of the memory cell $S^{i3}$ are in an overlap region in which a read current occurs both for the value 0 and for the value 1, or if both the read current $W_A^{i4}$ of the memory cell $S^{i4}$ and the read current $W_A^{i5}$ of the memory cell $S^{i5}$ are in an overlap region in which both a read current occurs for the value 1 and a read current occurs for the value 2.

An error-free assignment of digital values is therefore also advantageously possible for polyvalent digital memories with a high degree of probability because, based on the 6 memory cells, an incorrect assignment is possible only for a small portion of the memory cells and because the read currents of two memory cells in each case must be in an overlap region at the same time for this purpose.

It is therefore advantageous that read errors occur only rarely when reading the stored memory cell values. During reading, the physical values which have been read or the values of different memory cells determined from the physical values which have been read can be compared with one another, which, as a result, can then be equivalent to effectively reducing the read errors. An incorrect result of a comparison can occur only when the two values to be compared are in an overlap region at the same time.

It is also possible to read the values stored in n memory cells as K-valent memory cell values using reference values if code words stored in corresponding n memory cells form an ($n_1$-,$n_2$-, . . . , $n_K$-out-of-n) code.

Example: Tetravalent Memory Cell Values

Figure 17:
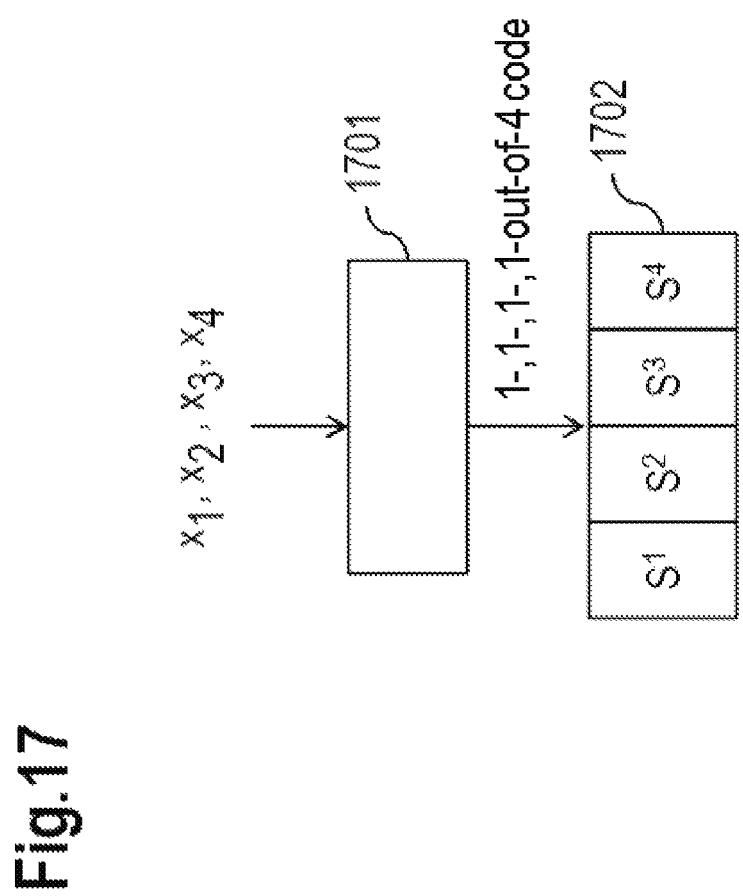
FIG. 17 shows a schematic arrangement for transforming four data bits $x_1, x_2, x_3, x_4$ into four memory cell values $z_1, z_2, z_3, z_4$.

FIG. 17 shows a schematic arrangement according to one embodiment for transforming four data bits $x_1$, $x_2$, $x_3$, $x_4$ into four memory cell values $z_1$, $z_2$, $z_3$, $z_4$.

The four data bits $x_1$, $x_2$, $x_3$, $x_4$ are present at the input of a transformation circuit 1701. These four data bits are transformed into the four memory cell values $z_1$, $z_2$, $z_3$, $z_4$ using the transformation circuit 1701 and are stored in memory cells $S^1$, $S^2$, $S^3$, $S^4$ of a memory 1702.

In this example, the memory 1702 comprises the group of the n=4 memory cells $S^1$, $S^2$, $S^3$, $S^4$, wherein four different values 0, 1, 2, 3 and 4, for example, can be stored in each of the memory cells. There is therefore one memory cell for each subgroup, that is to say $n_1$=$n_2$=$n_3$=$n_4$=1.

In the error-free case, the memory cell values $z_1$, $z_2$, $z_3$, $z_4$ form a code word of a 1-,1-,1-,1-out-of-4 code with 4·3·2·1=24 possible code words. Therefore, 24 different digital values can be stored in the group having n=4 memory cells.

Figure 5:
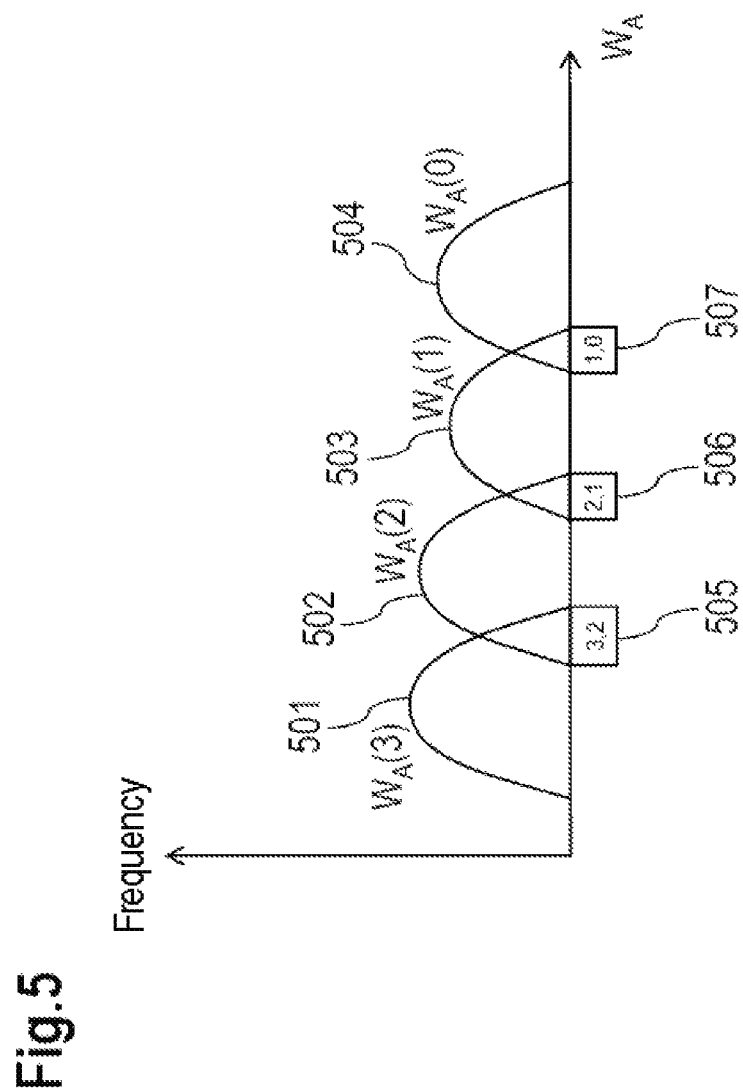
FIG. 5 shows a graph which illustrates four frequency distributions of values 0, 1, 2 and 3 read from the memory, wherein there are three overlap regions for the four frequency distributions.

FIG. 5 shows, for example, a frequency distribution 501 for the values 3 read from the memory 1702, a frequency distribution 502 for the values 2 read from the memory 1702, a frequency distribution 503 for the values 1 read from the memory 1702 and a frequency distribution 504 for the values 0 read from the memory 1702. The frequency distribution 501 is also denoted $W_A(3)$, the frequency distribution 502 is also denoted $W_A(2)$, the frequency distribution 503 is also denoted $W_A(1)$ and the frequency distribution 504 is also denoted $W_A(0)$.

Each of the values 0, 1, 2, 3 and 4 can be stored in one of the plurality of tetravalent memory cells of the memory 1702.

For example, the value read from the memory 1702 may be a current intensity (a read current), wherein one of the values 0, 1, 2, 3 or 4 results depending on the level of this current intensity.

The frequency distributions 501 and 502 have an overlap region 505, the frequency distributions 502 and 503 have an overlap region 506 and the frequency distributions 503 and 504 have an overlap region 507.

If the current intensity $W_A(\tau)^i$ of the read current of the memory cell $S^i$ is integrated over time t, the predefined threshold value Sw is reached at a particular time $t_i$.

If the current intensity $W_A(\tau)^j$ of the read current of the memory cell $S^j$ is integrated over time t, the predefined threshold value Sw is reached at a particular time $t_j$.

If, for example, the value 3 is stored in the memory cell $S^i$ and one of the digital values 0, 1 or 2 is stored in the memory cell $S^j$, $t_j < t_i$ since the read current $W_A^i$ of the memory cell $S^i$ is less than the read current $W_A^j$ of the memory cell $S^j$.

If, for example, the value 1 is stored in the memory cell $S^i$ and one of the values 3 or 2 is stored in the memory cell $S^j$, $t_j > t_i$ since the read current $W_A^i$ of the memory cell $S^i$ is greater than the read current $W_A^j$ of the memory cell $S^j$.

If, for example, $t_1 < t_3 < t_2 < t_4$, the resulting sequence of the memory cells is: $S^1$, $S^3$, $S_2$, $S_4$. The value 0 can be assigned to the memory cell $S^1$, the value 1 can be assigned to the memory cell $S^3$, the value 2 can be assigned to the memory cell $S^2$ and the value 3 can be assigned to the memory cell $S^4$.

The four data bits $x_1$, $x_2$, $x_3$, $x_4$ are present at the input of the transformation circuit 1701 and the memory cell values $z_1$, $z_2$, $z_3$, $z_4$ are output at the output of the transformation circuit 1701. This transformation which is carried out in the transformation circuit 1701 can be determined according to table 1, for example.

TABLE 1

| Row | $x_1$ | $x_2$ | $x_3$ | $x_4$ | $z_1$ | $z_2$ | $z_3$ | $z_4$ |
|---|---|---|---|---|---|---|---|---|
| 1 | 0 | 0 | 0 | 0 | 3 | 2 | 1 | 0 |
| 2 | 0 | 0 | 0 | 1 | 3 | 2 | 0 | 1 |
| 3 | 0 | 0 | 1 | 0 | 3 | 1 | 2 | 0 |
| 4 | 0 | 0 | 1 | 1 | 3 | 1 | 0 | 2 |
| 5 | 0 | 1 | 0 | 0 | 3 | 0 | 1 | 2 |
| 6 | 0 | 1 | 0 | 1 | 3 | 0 | 2 | 1 |
| 7 | 0 | 1 | 1 | 0 | 2 | 3 | 1 | 0 |
| 8 | 0 | 1 | 1 | 1 | 2 | 3 | 0 | 1 |
| 9 | 1 | 0 | 0 | 0 | 2 | 1 | 3 | 0 |
| 10 | 1 | 0 | 0 | 1 | 2 | 1 | 0 | 3 |
| 11 | 1 | 0 | 1 | 0 | 2 | 0 | 3 | 1 |
| 12 | 1 | 0 | 1 | 1 | 2 | 0 | 1 | 3 |
| 13 | 1 | 1 | 0 | 0 | 1 | 3 | 2 | 0 |
| 14 | 1 | 1 | 0 | 1 | 3 | 0 | 2 | 2 |
| 15 | 1 | 1 | 1 | 0 | 1 | 2 | 3 | 0 |
| 6 | 1 | 1 | 1 | 1 | 1 | 2 | 0 | 3 |

The four data bits $x_1$, $x_2$, $x_3$, $x_4$ can assume 16 different binary values $0000, \ldots, 1111$ which are all shown in table 1 above. In this case, each row corresponds to a transformation of data bits $x_i$ into a code word $z_i$ of the 1-,1-,1-,1-out-of-4 code, which transformation can be carried out by the transformation circuit 1701.

For example, the third row in table 1 shows that the code word 3120 is assigned to the data bits 0010.

As already stated, there are 24 different code words of the 1-,1-,1-,1-out-of-4 code. These 24 code words are confronted with 16 different values for $x_1$, $x_2$, $x_3$, $x_4$. According to table 1, only 16 of the 24 possible code words are used.

If, when reading the memory cells $S^1$, $S^2$, $S^3$, $S^4$, four memory cell values $z_1$, $z_2$, $z_3$, $z_4$ are determined and, in the error-free case, form a code word of the 1-,1-,1-,1-out-of-4 code, these memory cell values are transformed into the corresponding data bits $x_1$, $x_2$, $x_3$, $x_4$ according to table 1. A possible back-transformation is shown in table 2.

TABLE 2

| Row | $z_1$ | $z_2$ | $z_3$ | $z_4$ | $x_1$ | $x_2$ | $x_3$ | $x_4$ |
|---|---|---|---|---|---|---|---|---|
| 1 | 3 | 2 | 1 | 0 | 0 | 0 | 0 | 0 |
| 2 | 3 | 2 | 0 | 1 | 0 | 0 | 0 | 1 |
| 3 | 3 | 1 | 2 | 0 | 0 | 0 | 1 | 0 |
| 4 | 3 | 1 | 0 | 2 | 0 | 0 | 1 | 1 |
| 5 | 3 | 0 | 1 | 2 | 0 | 1 | 0 | 0 |
| 6 | 3 | 0 | 2 | 1 | 0 | 1 | 0 | 1 |
| 7 | 2 | 3 | 1 | 0 | 0 | 1 | 1 | 0 |
| 8 | 2 | 3 | 0 | 1 | 0 | 1 | 1 | 1 |
| 9 | 2 | 1 | 3 | 0 | 1 | 0 | 0 | 0 |
| 10 | 2 | 1 | 0 | 3 | 1 | 0 | 0 | 1 |
| 11 | 2 | 0 | 3 | 1 | 1 | 0 | 1 | 0 |
| 12 | 2 | 0 | 1 | 3 | 1 | 0 | 1 | 1 |
| 13 | 1 | 3 | 2 | 0 | 1 | 1 | 0 | 0 |
| 14 | 1 | 3 | 0 | 2 | 1 | 1 | 0 | 1 |
| 15 | 1 | 2 | 3 | 0 | 1 | 1 | 1 | 0 |
| 16 | 1 | 2 | 0 | 3 | 1 | 1 | 1 | 1 |
| 17 | 1 | 0 | 3 | 2 | — | — | — | — |
| 18 | 1 | 0 | 2 | 3 | — | — | — | — |
| 19 | 0 | 3 | 2 | 1 | — | — | — | — |
| 20 | 0 | 3 | 1 | 2 | — | — | — | — |
| 21 | 0 | 2 | 3 | 1 | — | — | — | — |
| 22 | 0 | 2 | 1 | 3 | — | — | — | — |
| 23 | 0 | 1 | 3 | 2 | — | — | — | — |
| 24 | 0 | 1 | 2 | 3 | — | — | — | — |

In table 2, the 16 possible assignments of the data bits are assigned to the 24 code words, in which case there are no data bits for some of the code words (rows 17 to 24 in table 2) or the data bits for these code words are undetermined. Table 2 therefore shows the inverse transformation to table 1.

For example, row 5 in table 1 shows that the code word 3012 is assigned to the data bits 0100. Accordingly, row 5 in table 2 shows that the data bits 0100 are assigned to the code word 3012.

The data bits are undetermined for rows 17 to 24 in table 2. During synthesis of an inverse transformation circuit, undetermined data bits can be used as so-called "don't care" values for circuit optimization. The undetermined data bits can also be set to an arbitrary value, for example to 0.

Example: 11 Data Bits in 8 Memory Cells

For example, k=11 data bits $x_1, \ldots, x_{11}$ can be transformed into 8 memory cells having the memory cell values $z_1, \ldots, z_8$. The memory cell values are code words of a 2-,2-,2-,2-out-of-8 code. Each memory cell value is tetravalent (K=4), that is to say one of four different values can be stored for each memory cell.

The 11 data bits can be used to represent $2^{11}=2048$ different values. The 2-,2-,2-,2-out-of-8 code comprises $$\binom{8}{2} \cdot \binom{6}{2} \cdot \binom{4}{2} \cdot \binom{2}{2} = 28 \cdot 15 \cdot 6 \cdot 1 = 2520$$

code words. These 2520 code words suffice to transform all 2048 binary values into code words of the 2-,2-,2-,2-out-of-8 code.

Example: 9 Data Bits in 7 Memory Cells

It is also possible to transform k=9 data bits $x_1, \ldots, x_9$ into n=7 memory cells having the memory cell values $z_1, \ldots, z_7$. The memory cell values are code words of a 2-,2-,2-,1-out-of-7 code. Each memory cell value is tetravalent (K=4), for example.

The 9 data bits can be used to represent $2^9=512$ different values. The 2-,2-,2-,1-out-of-7 code comprises $$\binom{7}{2} \cdot \binom{5}{2} \cdot \binom{3}{2} \cdot \binom{1}{1} = 21 \cdot 10 \cdot 3 \cdot 1 = 630$$

code words. These 630 code words suffice to transform all 512 binary values into code words of the 2-,2-,2-,1-out-of-7 code.

It is advantageous, for example, that a reference value is not required when reading and determining digital memory cell values which form code words of an $$n_1\text{-}, \ldots, n_K\text{-out-of-}n \text{ code}.$$

The digital memory cell values which have been read can be determined by mutually comparing the physical values read from memory cells or comparing values derived from physical values which have been read, as a result of which the probability of read errors is also low when the frequency distributions for the different memory cell values have overlap regions.

Reading the Memory by Means of Comparators

Figure 6:
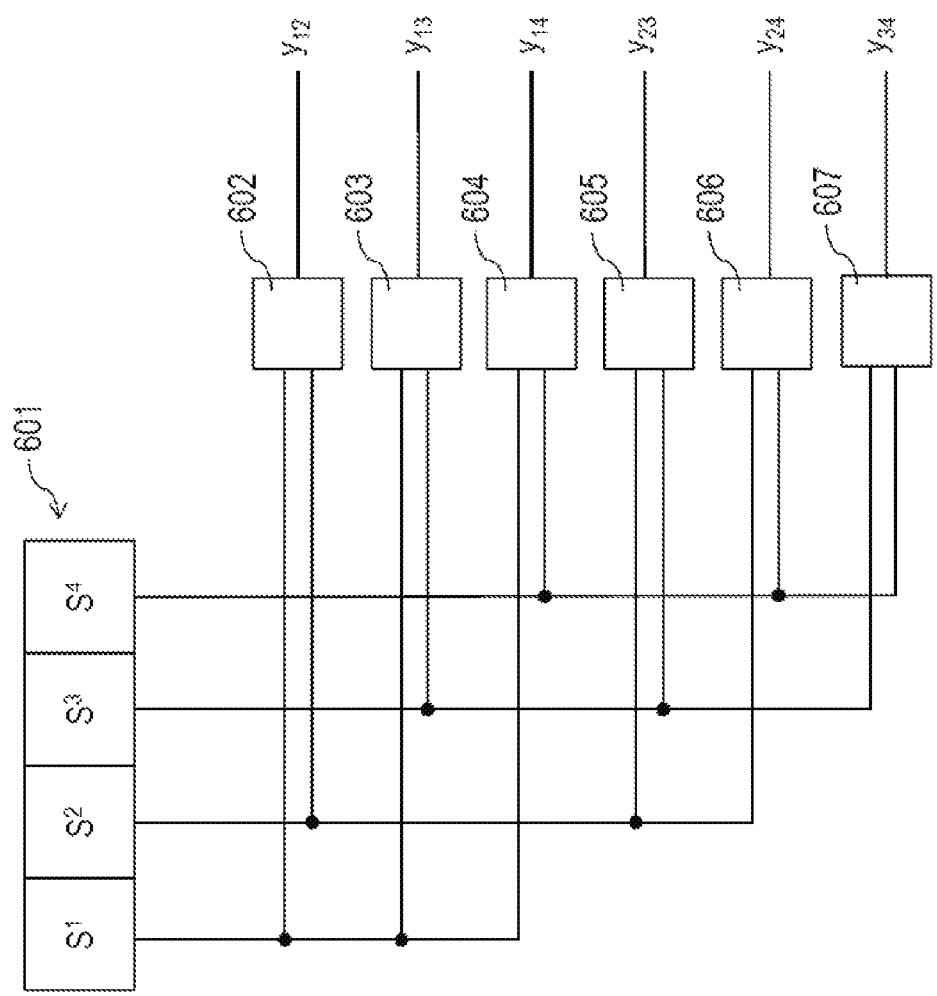
FIG. 6 shows a memory having four memory cells, wherein physical values are read from the memory cells and are compared in pairs using a plurality of comparators.

FIG. 6 shows a memory 601 according to one embodiment comprising n=4 memory cells $S^1$, $S^2$, $S^3$ and $S^4$. The values $W_A^1$, $W_A^2$, $W_A^3$ and $W_A^4$ are read at the outputs of the memory cells and are compared in pairs using $$\binom{4}{2} = 6$$

comparators 602 to 607.

The comparator 602 compares the values $W_A^1$ and $W_A^2$ read from the memory cells $S^1$ and $S^2$. The comparator 602 is configured in such a manner that it outputs a binary value $y_{12}=1$ at its output if $W_A^1 > W_A^2$ for the values which have been read and outputs the binary value $y_{12}=0$ if $W_A^1 < W_A^2$ for the values which have been read.

The comparator 603 compares the values $W_A^1$ and $W_A^3$ read from the memory cells $S^1$ and $S^3$. The comparator 603 is configured in such a manner that it outputs a binary value $y_{13}=1$ at its output if $W_A^1 > W_A^3$ for the values which have been read and outputs the binary value $y_{13}=0$ if $W_A^1 < W_A^3$ for the values which have been read.

The comparator 604 compares the values $W_A^1$ and $W_A^4$ read from the memory cells $S^1$ and $S^4$. The comparator 604 is configured in such a manner that it outputs a binary value $y_{14}=1$ at its output if $W_A^1 > W_A^4$ for the values which have been read and outputs the binary value $y_{14}=0$ if $W_A^1 < W_A^4$ for the values which have been read.

The comparator 605 compares the values $W_A^1$ and $W_A^3$ read from the memory cells $S^2$ and $S^3$. The comparator 605 is configured in such a manner that it outputs a binary value $y_{23}=1$ at its output if $W_A^2 > W_A^3$ for the values which have been read and outputs the binary value $y_{23}=0$ if $W_A^2 < W_A^3$ for the values which have been read.

The comparator 606 compares the values $W_A^2$ and $W_A^4$ read from the memory cells $S^2$ and $S^4$. The comparator 606 is configured in such a manner that it outputs a binary value $y_{24}=1$ at its output if $W_A^2 > W_A^4$ for the values which have been read and outputs the binary value $y_{24}=0$ if $W_A^2 < W_A^4$ for the values which have been read.

The comparator 607 compares the values $W_A^3$ and $W_A^4$ read from the memory cells $S^3$ and $S^4$. The comparator 607 is configured in such a manner that it outputs a binary value $y_{34}=1$ at its output if $W_A^3 > W_A^4$ for the values which have been read and outputs the binary value $y_{34}=0$ if $W_A^3 < W_A^4$ for the values which have been read.

If two subgroups have a size of $n_1 = n_2 = 2$, $$\binom{n}{n_1} \cdot \binom{n-n_1}{n_2} = \binom{4}{2} \cdot \binom{4-2}{2} = 6 \cdot 1 = 6$$

assignments can be stored in the group having n=4 memory cells $S^1$ to $S^4$.

For these 6 assignments, table 3 shows the output values $y_{12}, y_{13}, y_{14}, y_{23}, y_{24}, y_{34}$ from the 6 comparators 602 to 607.

TABLE 3

| $S^1$ | $S^2$ | $S^3$ | $S^4$ | $y_{12}$ | $y_{13}$ | $y_{14}$ | $y_{23}$ | $y_{24}$ | $y_{34}$ | Function |
|---|---|---|---|---|---|---|---|---|---|---|
| 1 | 1 | 0 | 0 | — | 1 | 1 | 1 | 1 | — | $y_{13} \hat{} y_{14} \hat{} y_{23} \hat{} y_{24}$ |
| 1 | 0 | 1 | 0 | 1 | — | 1 | 0 | — | 1 | $y_{12} \hat{} y_{14} \hat{} \bar{y}_{23} \hat{} y_{34}$ |
| 1 | 0 | 0 | 1 | 1 | 1 | — | — | 0 | 0 | $y_{12} \hat{} y_{13} \hat{} \bar{y}_{24} \hat{} \bar{y}_{34}$ |
| 0 | 1 | 1 | 0 | 0 | 0 | — | — | 1 | 1 | $\bar{y}_{12} \hat{} \bar{y}_{13} \hat{} y_{24} \hat{} y_{34}$ |
| 0 | 1 | 0 | 1 | 0 | — | 0 | 1 | — | 0 | $\bar{y}_{12} \hat{} \bar{y}_{14} \hat{} y_{23} \hat{} \bar{y}_{34}$ |
| 0 | 0 | 1 | 1 | — | 0 | 0 | 0 | 0 | — | $\bar{y}_{13} \hat{} \bar{y}_{14} \hat{} \bar{y}_{23} \hat{} \bar{y}_{24}$ |

For example, the first row in table 3 describes the fact that the binary values 1100 are assigned to the memory cells $S^1$ to $S^4$. The comparators 602 to 607 then output the binary values $y_{13}=y_{14}=y_{23}=y_{24}=1$. Since the binary value 1 is assigned to both of the memory cells $S^1$ and $S^2$, the values $W_A^1$ and $W_A^2$ a which are both assigned to a stored binary value 1 are compared with one another by the comparator 602. In this case, it is not possible to predict whether $W_A^1 < W_A^2$ or $W_A^1 > W_A^2$, with the result that the output value $y_{12}$ from the comparator 602 is undetermined. The output $y_{34}$ from the comparator 607 is also undetermined since the values $W_A^3$ and $W_A^4$ of the memory cells $S^3$ and $S^4$ both have the binary value 0.

Therefore, the output values from a comparator are undetermined in table 3 if the output values of the associated memory cells to be compared have the same values.

In the "function" column, Boolean expressions each as a conjunction of negated or non-negated output values from the corresponding comparators are assigned to the rows in table 3: if the output value $y_{ij}$ is equal to 1, the output value appears in the conjunction; if, in contrast, the output value $y_{ij}$ is 0, the negated output value $\bar{y}_{ij}$ appears in the conjunction. If the output value is undetermined ("-"), it does not appear in the conjunction. This reduces the outlay for the circuitry implementation, in particular.

For each of the 6 assignments of bits of a 2-out-of-4 code to the memory cells $S^1$ to $S^4$, precisely one of the 6 conjunctions assumes the value 1: for example, the assignment 1001 to the memory cells according to the third row in table 3 thus corresponds to the conjunction $$y_{12} \hat{} y_{13} \hat{} \bar{y}_{24} \hat{} \bar{y}_{34} = 1 \hat{} 1 \hat{} 1 \hat{} 1 = 1.$$

The comparators 602, 603, 606 and 607 output the values $y_{12}=1$, $y_{13}=1$, $y_{24}=0$ and $y_{34}=0$. All other conjunctions shown in table 3 have the value 0 in this case.

Therefore, as a result of the fact that the conjunction $y_{12} \hat{} y_{13} \hat{} \bar{y}_{24} \hat{} \bar{y}_{34}$ has the value 1, it is uniquely determined that the assignment 1001 has been read from the memory cells $S^1$ to $S^4$.

Determination of the Assignment to the Memory Cells

Figure 7:
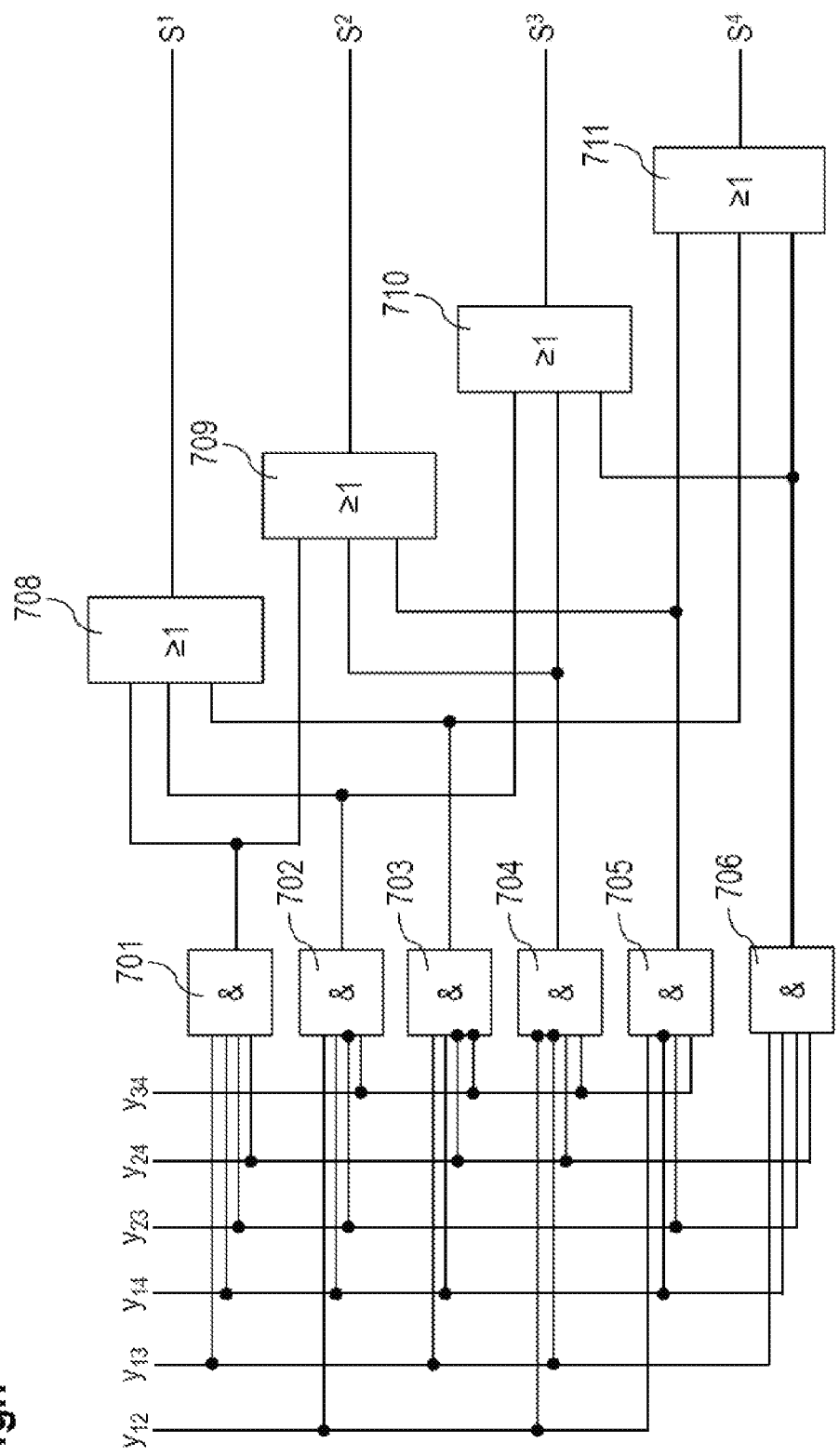
FIG. 7 shows a circuit arrangement which is used to determine the corresponding assignments to the memory cells from the values from the comparators from the circuit according to FIG. 6 by means of a plurality of logic gates.

FIG. 7 shows a circuit arrangement according to one embodiment which is used to determine the corresponding assignments to the memory cells $S^1$ to $S^4$ from the values $y_{12}, y_{13}, y_{14}, y_{23}, y_{24}$ and $y_{34}$ from the comparators 602 to 607. For example, six AND gates 701 to 706 each with four inputs and four OR gates 708 to 711 each with three inputs are used for this purpose.

The values $y_{13}, y_{14}, y_{23}$ and $y_{24}$ are passed to the inputs of the AND gate 701. The values $y_{12}, y_{14}, \bar{y}_{23}$ and $y_{24}$ are passed to the inputs of the AND gate 702. The values $y_{12}, y_{13}, \bar{y}_{24}$ and $\bar{y}_{34}$ are passed to the inputs of the AND gate 703. The values $\bar{y}_{12}, \bar{y}_{13}, y_{24}$ and $y_{34}$ are passed to the inputs of the AND gate 704. The values $\bar{y}_{12}$, $\bar{y}_{14}$, $y_{23}$ and $\bar{y}_{34}$ are passed to the inputs of the AND gate 705. The values $\bar{y}_{13}$, $\bar{y}_{14}$, $\bar{y}_{23}$ and $\bar{y}_{24}$ are passed to the inputs of the AND gate 706.

Furthermore, the outputs of the AND gates 701 to 706 are connected to the inputs of the OR gates 708 to 711 as follows: the output of the AND gate 701 is connected to one of the inputs of each of the OR gates 708 and 709. The output of the AND gate 702 is connected to one of the inputs of each of the OR gates 708 and 710. The output of the AND gate 703 is connected to one of the inputs of each of the OR gates 708 and 711. The output of the AND gate 704 is connected to one of the inputs of each of the OR gates 709 and 710. The output of the AND gate 705 is connected to one of the inputs of each of the OR gates 709 and 711. The output of the AND gate 706 is connected to one of the inputs of each of the OR gates 710 and 711.

The assignment to the memory cell $S^1$ is provided at the output of the OR gate 708, the assignment to the memory cell $S^2$ is provided at the output of the OR gate 709, the assignment to the memory cell $S^3$ is provided at the output of the OR gate 710 and the assignment to the memory cell $S^4$ is provided at the output of the OR gate 711.

The circuit arrangement according to FIG. 7 therefore visualizes the above table 3 as follows: the functions in table 3 are represented at the outputs of the AND gates 701 to 706, wherein the AND gate 701 corresponds to the function in the first row and the AND gate 706 corresponds to the function in the last row in table 3. The assignment to the memory cell $S^i$ according to FIG. 7 results from the column of the memory cell $S^i$ as follows: there is a logical OR combination to form the function (conjunction) in that row in the table in which this column has the value 1. For example, the memory cell $S^1$ has the value 1 in the first three rows in table 3, that is to say there is an OR combination with the outputs from the AND gates 701, 702 and 703 which represent the conjunctions in the first three rows in table 3. This accordingly applies to the other memory cells.

Example: Trivalent Memory Cells

An example with trivalent memory cells, that is to say each of the memory cells can assume one of the values 0, 1 or 2, is considered below, in which case 2>1>0, for example.

The case in which the group has n=6 memory cells and the subgroups have $n_1=n_2=n_3=2$ memory cells is considered. Therefore, the value 2 can be stored twice, the value 1 can be stored twice and the value 0 can be stored twice for each group of 6 memory cells. There are therefore $$\binom{6}{2} \cdot \binom{4}{2} \cdot \binom{2}{2} = 15 \cdot 6 \cdot 1 = 90$$

possible ways of assigning two twos, two ones and two zeros to a group of 6 memory cells $S^1$ to $S^6$.

If the value read from all memory cells is compared in pairs when reading data from the memory cells, 15 comparators $VGL_{ij}$ are used to compare all physical output values from the memory cells $S^1$ to $S^6$, wherein i, j=1 . . . 6 are indices each denoting one of the memory cells. Therefore, the comparator $VGL_{ij}$ compares the memory cell $S^i$ with the memory cell $S^j$. The 15 comparators are therefore:
$VGL_{12}$, $VGL_{13}$, $VGL_{14}$, $VGL_{15}$, $VGL_{16}$,
$VGL_{23}$, $VGL_{24}$, $VGL_{25}$, $VGL_{26}$,
$VGL_{34}$, $VGL_{35}$, $VGL_{36}$,
$VGL_{45}$, $VGL_{46}$ and
$VGL_{56}$.

A binary output value from the comparator $VGL_{ij}$ is denoted $y_{ij}$, with the result that there are accordingly the following 15 binary output values:
$y_{12}$, $y_{13}$, $y_{14}$, $y_{15}$, $y_{16}$,
$y_{23}$, $y_{24}$, $y_{25}$, $y_{26}$,
$y_{34}$, $y_{35}$, $y_{36}$,
$y_{45}$, $y_{46}$ and
$y_{56}$.

For the assignment 221100 to the memory cells $S^1$ to $S^6$, table 4 shows the output values from these 15 comparators.

TABLE 4

| $S^1$ | $S^2$ | $S^3$ | $S^4$ | $S^5$ | $S^6$ | $y_{12}$ | $y_{13}$ | $y_{14}$ | $y_{15}$ | $y_{16}$ | $y_{23}$ | $y_{24}$ | $y_{25}$ |
|---|---|---|---|---|---|---|---|---|---|---|---|---|---|
| 2 | 2 | 1 | 1 | 0 | 0 | — | 1 | 1 | 1 | 1 | 1 | 1 | 1 |
|  |  |  |  |  |  | $y_{26}$ | $y_{34}$ | $y_{35}$ | $y_{36}$ | $y_{45}$ | $y_{46}$ | $y_{56}$ |  |
|  |  |  |  |  |  | 1 | — | 1 | 1 | 1 | 1 | — |  |

The following conjunction results:

$$y_{13}\hat{\,}y_{14}\hat{\,}y_{15}\hat{\,}y_{16}\hat{\,}y_{23}\hat{\,}y_{24}\hat{\,}y_{25}\hat{\,}y_{26}\hat{\,}y_{35}\hat{\,}y_{36}\hat{\,}y_{45}\hat{\,}y_{46}.$$

This conjunction has 12 values from the 15 comparators. These are those values which are not undetermined.

In principle: a value 1 indicates a non-inverted or non-negated value $y_{ij}$ and a value 0 indicates an inverted or negated value $\bar{y}_{ij}$ from the respective comparator.

For the assignment 212100 to the memory cells $S^1$ to $S^6$, table 5 shows the output values from the 15 comparators.

TABLE 5

| $S^1$ | $S^2$ | $S^3$ | $S^4$ | $S^5$ | $S^6$ | $y_{12}$ | $y_{13}$ | $y_{14}$ | $y_{15}$ | $y_{16}$ | $y_{23}$ | $y_{24}$ | $y_{25}$ |
|---|---|---|---|---|---|---|---|---|---|---|---|---|---|
| 2 | 1 | 2 | 1 | 0 | 0 | 1 | — | 1 | 1 | 1 | 0 | — | 1 |
|  |  |  |  |  |  | $y_{26}$ | $y_{34}$ | $y_{35}$ | $y_{36}$ | $y_{45}$ | $y_{46}$ | $y_{56}$ |  |
|  |  |  |  |  |  | 1 | — | 1 | 1 | 1 | 1 | — |  |

The following conjunction results:

$$y_{12}\hat{\,}y_{14}\hat{\,}y_{15}\hat{\,}y_{16}\hat{\,}\bar{y}_{23}\hat{\,}y_{25}\hat{\,}y_{26}\hat{\,}y_{35}\hat{\,}y_{36}\hat{\,}y_{45}\hat{\,}y_{46}.$$

The conjunction has 12 output values from the 15 comparators.

For the assignment 001122 to the memory cells $S^1$ to $S^6$, table 6 shows the output values from the 15 comparators.

TABLE 6

| $S^1$ | $S^2$ | $S^3$ | $S^4$ | $S^5$ | $S^6$ | $y_{12}$ | $y_{13}$ | $y_{14}$ | $y_{15}$ | $y_{16}$ | $y_{23}$ | $y_{24}$ | $y_{25}$ |
|---|---|---|---|---|---|---|---|---|---|---|---|---|---|
| 0 | 0 | 1 | 1 | 2 | 2 | — | 0 | 0 | 0 | 0 | 0 | 0 | 0 |
|  |  |  |  |  |  | $y_{26}$ | $y_{34}$ | $y_{35}$ | $y_{36}$ | $y_{45}$ | $y_{46}$ | $y_{56}$ |  |
|  |  |  |  |  |  | 0 | — | 0 | 0 | 0 | 0 | — |  |

The following conjunction results:

$$\bar{y}_{13}\hat{\,}\bar{y}_{14}\hat{\,}\bar{y}_{15}\hat{\,}\bar{y}_{16}\hat{\,}\bar{y}_{23}\hat{\,}\bar{y}_{24}\hat{\,}\bar{y}_{25}\hat{\,}\bar{y}_{26}\hat{\,}\bar{y}_{35}\hat{\,}\bar{y}_{36}\hat{\,}\bar{y}_{45}\hat{\,}\bar{y}_{46}.$$

The conjunction has 12 output values from the 15 comparators.

For the remaining assignments of two twos, two ones and two zeros to each of the memory cells, the associated conjunctions accordingly result. 12 of the 15 output values (inverted or not) which are not undetermined respectively form the corresponding conjunctions. These conjunctions assume the value 1 precisely when the memory cells $S^1$ to $S^6$ store the assignments corresponding to them and the values $W_A^1$ to $W_A^6$ read from the memory cells are compared in pairs in the comparators $VGL_{ij}$.

Example: Transformation and Inverse Transformation

Figure 8:
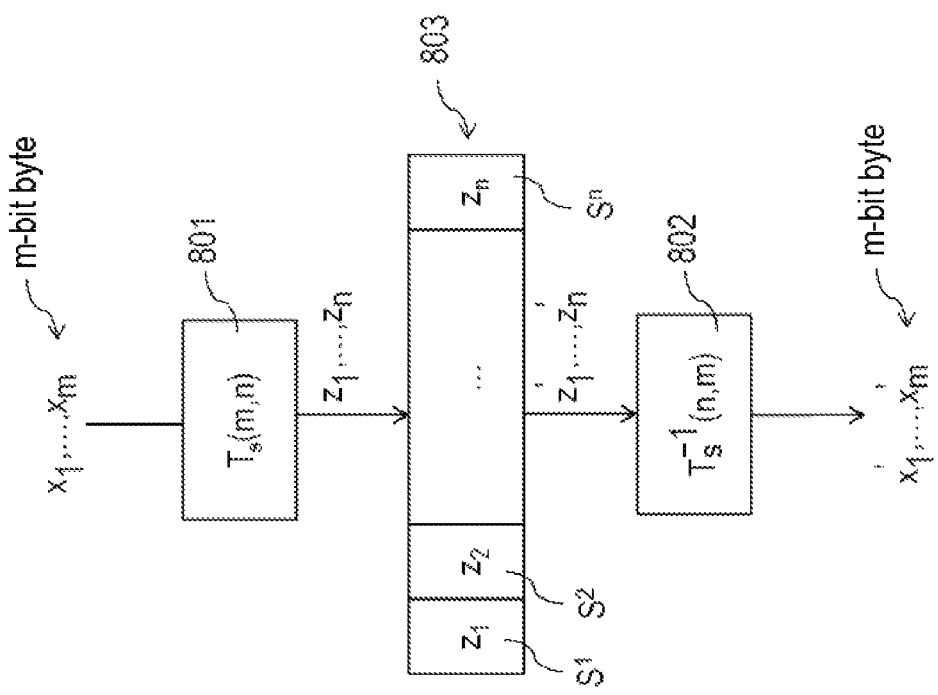
FIG. 8 shows a schematic diagram in which data bits are transformed, are stored in memory cells of a memory, the memory cells are read and are transformed back into data bits by means of an inverse transformation.

FIG. 8 shows an embodiment in which m data bits are stored in memory cells $S^1$ to $S^n$ of a memory 803. Shown is a group of n memory cells $S^1$ to $S^n$, wherein
$n_1$ first values are stored in $n_1$ memory cells,
$n_2$ second values are stored in $n_2$ memory cells, and
$n_K$ Kth values are stored in $n_K$ memory cells.

In other words, there is a number of K subgroups. A particular number of identical values is stored in each subgroup. Different values are stored in different subgroups.

The m data bits which are stored in the group of n memory cells can also be referred to as an m-bit byte or simply as a byte. The letters m and k are used as the variable for the number of data bits.

In this case, $$2^m \leq N$$

where $$\binom{n}{n_1} \cdot \binom{n-n_1}{n_2} \cdot \ldots \cdot \binom{n-n_1-\ldots-n_{K-1}}{n_K} = N$$

and m<n. In this case, N denotes the number of possible ways of assigning $n_1$ first values, $n_2$ second values, etc. up to $n_K$ Kth values to the group of n memory cells.

A transformation circuit 801 carries out a transformation $T_S(m, n)$ which transforms $2^m$ data bits of the word width m into $2^m$ of the N values $z_1, z_2, \ldots, z_n$, wherein
a number $n_1$ of the values of $z_1, z_2, \ldots, z_n$ are equal to 0,
a number $n_2$ of the values of $z_1, z_2, \ldots, z_n$ are equal to 1, and
a number $n_K$ of the values of $z_1, z_2, \ldots, z_n$ are equal to K−1.

If not all $2^m$ of the data bits of the word width m are required, it is possible to transform only the required data bits and store them in the memory cells.

The transformation circuit 801 is configured, for example, in such a manner that it represents the transformation T(m, n) of bit values $x_1, \ldots, x_m$ of the word width m into values $z_1, \ldots, z_n$ of the word width n which are intended to be stored in the memory cells $S^1$ to $S^n$, wherein
$n_1$ of the values of $z_1, \ldots, z_n$ have the value 0,
$n_2$ of the values of $z_1, \ldots, z_n$ have the value 1, and
$n_K$ of the values of $z_1, \ldots, z_n$ have the value (K−1).

The m bits $x_1, \ldots, x_m$ can be referred to as data bits, for example. In particular, it is possible to distinguish such data bits from values which are written to the memory cells of the memory. If the bits $x_1$ to $x_m$ are, for example, bits of a code word of an error code for error detection or error correction, these bits may also comprise at least one check bit of the error code or may be only check bits of the error code.

The memory cells $S^1$ to $S^n$ are read and the values $z'_1$ to $z'_n$ which have been read are transformed into data bits $x'_1$ to $x'_m$ by means of a transformation circuit 802 which provides a transformation $T_S^{-1}(n, m)$, wherein, in the error-free case:

$$x'_1, \ldots, x'_m = x_1, \ldots, x_m.$$

The transformation circuit 801 and the transformation circuit 802 are, in one embodiment, set up in such a manner that the following applies to the transformation T(m, n) and to the inverse transformation $T^{-1}(n, m)$:

$$T^{-1}(n,m)\{T(m,n)[x_1, \ldots, x_m]\} = x_1, \ldots, x_m.$$

If the bits $x_1$ to $x_m$ are referred to as an m-bit byte, an m-bit byte is stored as a word $z_1$ to $z_n$ in n memory cells of the memory, wherein a predetermined number of $n_1$ first memory cells stores a first value, a predetermined number of $n_2$ second memory cells stores a second value, etc. and a predetermined number $n_K$ of Kth memory cells stores a Kth value.

Example: with K=2, $n_1$ first memory cells store a first value 0 and $n_2$ second memory cells store a second value 1. Code words of an $n_2$-out-of-n code are then stored in the memory cells $S^1$ to $S^n$.

Further example: if four values can be stored in each of the memory cells $S^1$ to $S^n$, it is possible to store the first value in $n_1$ memory cells, to store the second value in $n_2$ memory cells, to store the third value in $n_3$ memory cells and to store the fourth value in $n_4$ memory cells. In this case: $n_1+n_2+n_3+n_4=n$.

As described, it is possible to compare physical properties (for example physical values) of different memory cells which have been read. This makes it possible to at least partially reduce error probabilities. An error can occur only if both of the values compared in pairs during reading are in the overlap region of frequency distributions of the physical values at the same time and an error cannot occur even when only an individual value is in such an overlap region.

Figure 9:
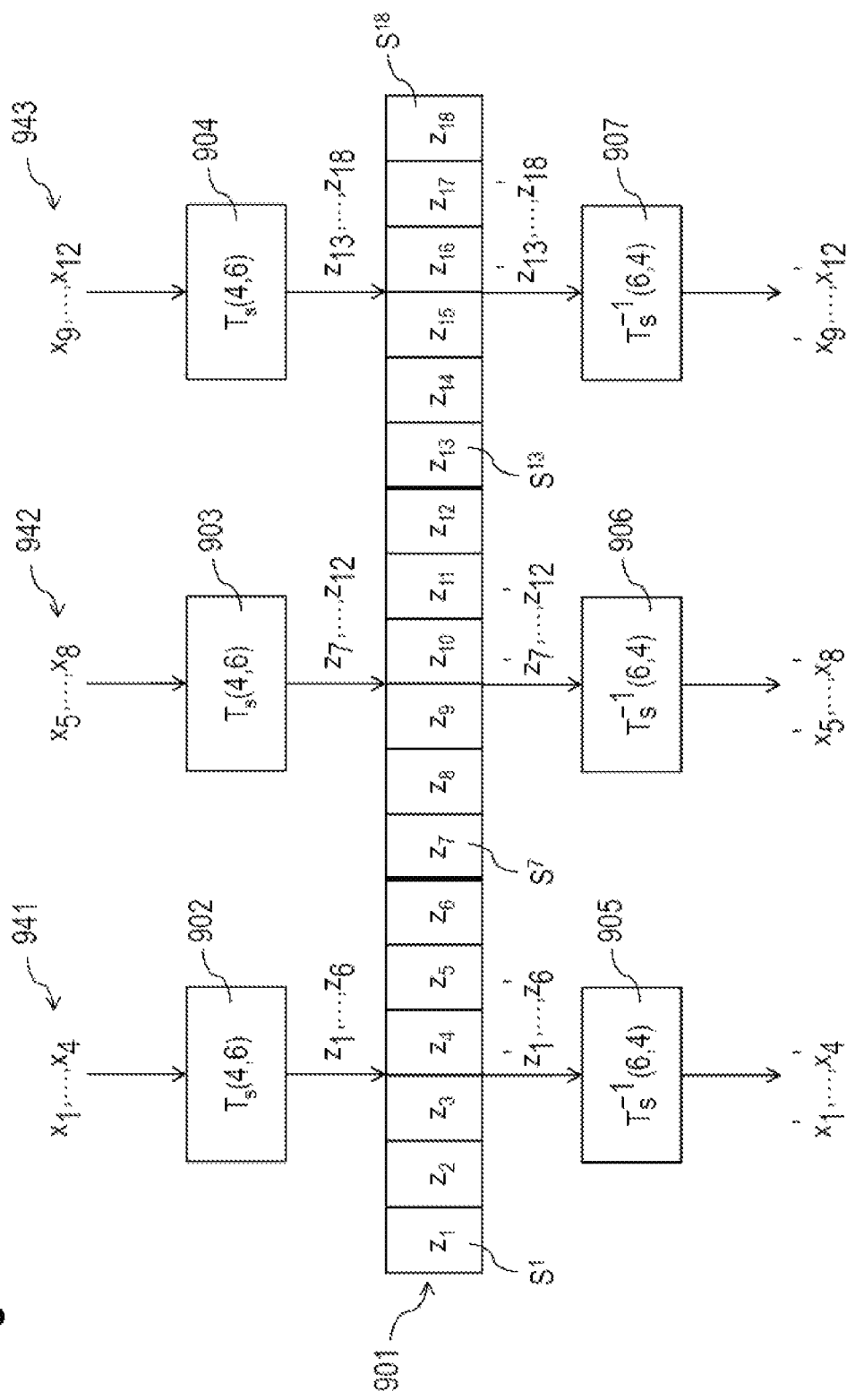
FIG. 9 shows a schematic diagram in which a plurality of groups of data bits are transformed, are stored, and are transformed back into data bits after reading.

Example: FIG. 9

FIG. 9 shows an example of storing m-bit bytes in n memory cells in each case, wherein m=4, n=6 and $n_1$=$n_2$=3. A first digital value 0 is stored in $n_1$=3 memory cells and a second digital value 1 is stored in $n_2$=3 second memory cells. The 4-bit byte is stored in 6 memory cells as a 6-bit word of a 3-out-of-6 code.

FIG. 9 shows the storage of three 4-bit bytes in 6 memory cells of a memory 901 in each case, wherein the memory cells can store digital binary values, for example. 4-bit bytes $x_1, x_2, x_3, x_4$ are transformed, by means of a transformation circuit 902, into binary values $z_1$ to $z_6$ which are stored in memory cells $S^1$ to $S^6$ of the memory 901. Furthermore, 4-bit bytes $x_5, x_6, x_7, x_8$ are transformed, by means of a transformation circuit 903, into binary values $z_7$ to $z_{12}$ which are stored in memory cells $S^7$ to $S^{12}$ of the memory 901. 4-bit bytes $x_9, x_{10}, x_{11}, x_{12}$ are also transformed, by means of a transformation circuit 904, into binary values $z_{13}$ to $z_{18}$ which are stored in memory cells $S^{13}$ to $S^{18}$ of the memory 901.

TABLE 7

| $x_1$ | $x_2$ | $x_3$ | $x_4$ | $z_1$ | $z_2$ | $z_3$ | $z_4$ | $z_5$ | $z_6$ |
|---|---|---|---|---|---|---|---|---|---|
| 0 | 0 | 0 | 0 | 1 | 1 | 1 | 0 | 0 | 0 |
| 1 | 1 | 1 | 1 | 0 | 0 | 0 | 1 | 1 | 1 |
| 0 | 0 | 0 | 1 | 1 | 1 | 0 | 1 | 0 | 0 |
| 1 | 1 | 1 | 0 | 0 | 0 | 1 | 0 | 1 | 1 |
| 0 | 0 | 1 | 0 | 1 | 1 | 0 | 0 | 1 | 0 |
| 1 | 1 | 0 | 1 | 0 | 0 | 1 | 1 | 0 | 1 |
| 0 | 0 | 1 | 1 | 1 | 1 | 0 | 1 | 0 | 0 |
| 1 | 1 | 0 | 0 | 0 | 0 | 1 | 0 | 1 | 1 |
| 0 | 1 | 0 | 0 | 1 | 0 | 1 | 0 | 1 | 0 |
| 1 | 0 | 1 | 1 | 0 | 1 | 0 | 1 | 0 | 1 |
| 0 | 1 | 0 | 1 | 1 | 0 | 1 | 0 | 1 | 0 |
| 1 | 0 | 1 | 0 | 0 | 1 | 0 | 1 | 0 | 1 |
| 0 | 1 | 1 | 0 | 1 | 0 | 1 | 0 | 0 | 1 |
| 1 | 0 | 0 | 1 | 0 | 1 | 0 | 1 | 1 | 0 |
| 0 | 1 | 1 | 1 | 1 | 0 | 0 | 1 | 1 | 0 |
| 1 | 0 | 0 | 0 | 0 | 1 | 1 | 0 | 0 | 1 |

Each of the transformation circuits 902 to 904 carries out a transformation T(4, 6). The transformation T(4, 6) can be described in the form of a table which assigns a different code word of a 3-out-of-6 code to each of the 16 possible 4-bit values. One example is shown in table 7.

Such a table can be implemented, for example, in the form of a combinational (logic) circuit or in the form of a read-only memory.

If the values or the memory cell values which are stored in the memory cells are binary values, these values can also be referred to as memory bits.

In the example described, the inversion of the data bits results in an inversion of the memory bits.

Optionally, different 4-bit bytes can be transformed into memory values, in particular memory bits, using a functionally identical transformation or an identically acting transformation circuit. It is likewise possible to transform different 4-bit bytes into memory bits or generally into memory values using functionally different transformations or transformation circuits. For example, at least two of the transformation circuits 902 to 904 can implement different transformations. The transformation circuits 905 to 907 then accordingly provide the appropriate inverse transformations.

For example, it is possible to provide transformations in which an inversion of the 4-bit byte x results in an inversion of the digital values z.

During reading from the memory 901, memory bits $z'_1$, $z'_2$, $z'_3$, $z'_4$, $z'_5$, $z'_6$ are read and are transformed into 4-bit bytes $x'_1$, $x'_2$, $x'_3$, $x'_4$ by the transformation circuit 905. Accordingly, memory bits $z'_7$, $z'_8$, $z'_9$, $z'_{10}$, $z'_{11}$, $z'_{12}$ are read and are transformed into 4-bit bytes $x'_5$, $x'_6$, $x'_7$, $x'_8$ by the transformation circuit 906. Memory bits $z'_{13}$, $z'_{14}$, $z'_{15}$, $z'_{16}$, $z'_{17}$, $z'_{18}$ are also read and are transformed into 4-bit bytes $x'_9$, $x'_{10}$, $x'_{11}$, $x'_{12}$ by the transformation circuit 907.

Each of the transformation circuits 905, 906 and 907 implements a transformation $T_S^{-1}(6, 4)$ which is an inverse transformation of the transformation shown in table 7, according to which n=6 state bits $z'_{(i \cdot n)}$ (i=1 . . . 3 and n=1 . . . 6) are respectively transformed into m=4 data bits $x'_{(i \cdot m)}$ (i=1 . . . 3 and m=1 . . . 4) in each case.

On account of errors, the memory bits $z'_{(i \cdot n)}$ read from the memory 901 may differ from the originally stored bits $z_{(i \cdot n)}$. Therefore, the data bits $x'_{i \cdot m}$ which have been read may also differ from the data bits $x_{i \cdot m}$ which have been written.

If an error has not occurred, the following applies to the first 4 data bits $x_1$ to $x_4$, the first 6 transformed bits $z_1$ to $z_6$, the first 6 bits $z'_1$ to $z'_6$ to be transformed back and the first 4 resulting data bits $x'_1$ to $x'_4$:

$$z_1, z_2, z_3, z_4, z_5, z_6 = z'_1, z'_2, z'_3, z'_4, z'_5, z'_6$$

$$x_1, x_2, x_3, x_4 = x'_1, x'_2, x'_3, x'_4.$$

This accordingly applies to the second 4 data bits and the third 4 data bits.

For the sake of completeness, a table 8 which illustrates a transformation $T_S^{-1}(6, 4)$ is shown. This is the inverse representation of the assignments shown in table 7.

TABLE 8

| $z'_1$ | $z'_2$ | $z'_3$ | $z'_4$ | $z'_5$ | $z'_6$ | $x'_1$ | $x'_2$ | $x'_3$ | $x'_4$ |
|---|---|---|---|---|---|---|---|---|---|
| 1 | 1 | 1 | 0 | 0 | 0 | 0 | 0 | 0 | 0 |
| 0 | 0 | 0 | 1 | 1 | 1 | 1 | 1 | 1 | 1 |
| 1 | 1 | 0 | 1 | 0 | 0 | 0 | 0 | 0 | 1 |
| 0 | 0 | 1 | 0 | 1 | 1 | 1 | 1 | 1 | 0 |
| 1 | 1 | 0 | 0 | 1 | 0 | 0 | 0 | 1 | 0 |
| 0 | 0 | 1 | 1 | 0 | 1 | 1 | 1 | 0 | 1 |
| 1 | 1 | 0 | 0 | 0 | 1 | 0 | 0 | 1 | 1 |
| 0 | 0 | 1 | 1 | 1 | 0 | 1 | 0 | 0 | 0 |
| 1 | 0 | 1 | 1 | 0 | 0 | 0 | 1 | 0 | 0 |
| 0 | 1 | 0 | 0 | 1 | 1 | 1 | 0 | 1 | 1 |
| 1 | 0 | 1 | 0 | 1 | 0 | 0 | 1 | 0 | 1 |
| 0 | 1 | 0 | 1 | 0 | 1 | 1 | 0 | 1 | 0 |

TABLE 8-continued

| $z'_1$ | $z'_2$ | $z'_3$ | $z'_4$ | $z'_5$ | $z'_6$ | $x'_1$ | $x'_2$ | $x'_3$ | $x'_4$ |
|---|---|---|---|---|---|---|---|---|---|
| 1 | 0 | 1 | 0 | 0 | 1 | 0 | 1 | 1 | 0 |
| 0 | 1 | 0 | 1 | 1 | 0 | 1 | 0 | 0 | 1 |
| 1 | 0 | 0 | 1 | 1 | 0 | 0 | 1 | 1 | 1 |
| 0 | 1 | 1 | 0 | 0 | 1 | 1 | 0 | 0 | 0 |

For values of the memory bits $z'_1$ to $z'_6$ which are not cited in table 8, any desired associated values of the data bits $x'_1$ to $x'_4$ can be predefined for the synthesis of the inverse transformation circuit 905. It is possible, for example, to have those arbitrary values which are also referred to as "don't care" values stipulated as undetermined values by means of a synthesis tool during optimization. It is also an option to set these values to 0.

Error Detection and/or Error Correction

If incorrect data bits are assigned to incorrect memory bits by the inverse transformation circuit 905, an incorrect 4-bit byte can be detected and/or corrected by means of an error code. This is explained by way of example below.

Figure 10:
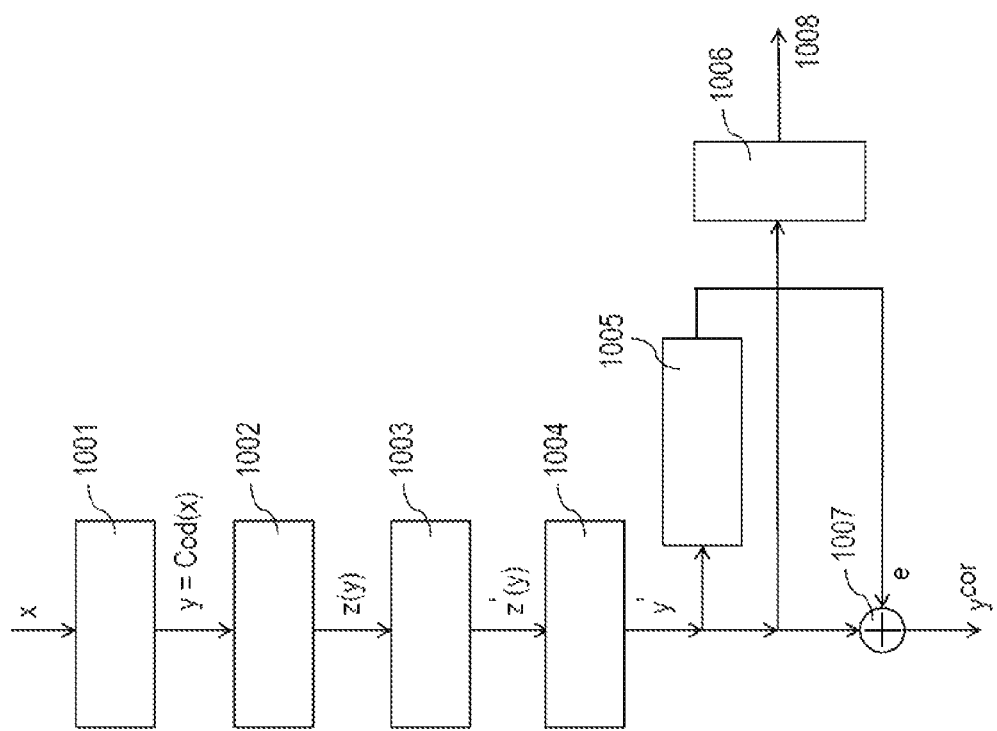
FIG. 10 shows an exemplary circuit arrangement which enables error detection or combined error detection with error correction, wherein the data bits are transformed, by means of a transformation circuit, into memory bits which are stored in memory cells of a memory.

FIG. 10 shows an circuit arrangement according to one embodiment which enables error detection or combined error detection with error correction, wherein the data bits are transformed, by means of a transformation circuit, into memory bits which are stored in memory cells of a memory.

Data bits x are present at the input of a coder 1001, at the output of which bits y=Cod(x) coded according to an error code C, are provided.

It is possible for the error code C, to be a byte error-correcting and/or error-detecting code, for example a Reed-Solomon code. It is also possible for the error code C, to be a bit error-correcting and/or error-detecting code, for example a BCH code, a Hsiao code, a Hamming code, a low-density parity code or another code.

The bits (or bytes) y=Cod(x) output at the output of the coder 1001 are transformed, by means of a transformation circuit 1002, into digital values z(y) which are written to memory cells of a memory 1003. The transformation circuit 1002 provides a transformation $T_S$.

In a group of n memory cells in each case, $n_1$ first values are stored in $n_1$ first memory cells, $n_2$ second values are stored in $n_2$ second memory cells, etc. up to $n_K$ Kth values are stored in $n_K$ Kth memory cells. In this case: $n_1 + n_2 + \ldots + n_K = n$.

In a next step, values z'(y) are read from the corresponding memory cells of the memory 1003. It is possible for the values z'(y) to differ from the values z(y) which have been written on account of at least one error. If an error has not occurred, z(y)=z'(y).

The values z'(y) read from the memory 1003 are transformed into binary values y' by an inverse transformation circuit 1004 which provides a transformation $T_S^{-1}$.

If an error has not occurred, $$y' = y = Cod(x).$$

If an error has occurred, $$y' \neq y = Cod(x).$$

In accordance with the error code $C_1$, a correction value generator 1005 forms a correction value e of corresponding word width, wherein the components of the correction value e are XORed with the values y' component by component in an XOR circuit 1007. The XOR circuit is a circuit which exclusively ORs the input signals and provides the result of this combination at the output. The XOR circuit provides the logical value 1 at the output when the signals at the inputs are the same. If the signals at the inputs are different, the XOR circuit provides the logical value 0 at the output.

A corrected value $y^{cor}$ is provided at the output of the XOR circuit 1007. If an error which can be corrected by the code $C_1$ by means of the correction value generator 1005 has occurred, the corrected bits are identical to the coded bits, that is to say $$y^{cor}=y=\text{Cod}(x).$$

An error detection circuit 1006 is also shown, which circuit can be used to determine whether an error and/or a particular type of error, which can be detected using the error code $C_1$, is present. The value y' is supplied to the error detection circuit 1006 and the error detection circuit 1006 outputs an item of error information 1008.

If the error code is, for example, a 1-byte error-correcting code and a 2-byte error-detecting code, the error detection circuit 1006 can output different items of error information 1008 depending on whether no error, a 1-byte error or a 2-byte error has occurred. For example, the error information 1008 can be coded as a bit string 00, 01 or 10 (that is to say a bit string having two bits in this example).

In one embodiment, the error detection circuit 1006 and the correction value generator 1005 may be implemented together or partially together.

If the error code $C_1$ is a separable code in which the data bits are not changed during coding by the coder 1001, bits output by the XOR circuit 1006 are identical to the corresponding data bits which have been input to the coder 1001 and have been stored in the memory 1003 after their transformation by the transformation circuit 1002, if an error has not occurred or if an error which can be corrected by the error code $C_1$ has occurred.

Figure 11:
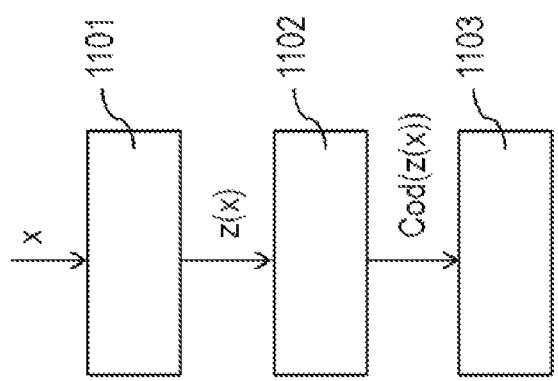
FIG. 11 shows an alternative circuit arrangement which enables error correction or error detection possibly with error correction.

FIG. 11 shows a circuit arrangement according to an embodiment which enables error correction or error detection possibly with error correction.

Data bits x are present at the input of a transformation circuit 1101 and are transformed into values z(x). The values z(x) from the transformation circuit 1101 are present at the input of a coder 1102 which is set up in such a manner that data Cod(z(x)) coded using an error code $C_2$ are provided at its output.

The coder 1102 may provide a coding function and a check bit transformation function.

For example, it shall be assumed that the error code $C_2$ is a separable code, with the result that the values z(x) present at the input of the coder 1102 are included without change in the output data Cod(z(x)) determined by the coder and are supplemented with check bits according to the error code $C_2$.

In this example, the coder 1102 is configured in such a manner that it outputs the values z(x) present at its input without change at its output (in this case, the input and the output may each have a plurality of lines, wherein each line is assigned to one bit) and additionally forms check bits from the bits z(x) according to the error code $C_2$ and also transforms these check bits before they are stored in a memory 1103.

The values z(x) form, for example, groups of n bits which consist of code words of an $n_1$-out-of-n code. The transformed check bits provided by the coder 1102 may likewise be $n_1$-out-of-n code words or may comprise such code words in this case.

It is possible, for example, for the check bits determined from the bits z(x) by means of the error code $C_2$ to be provided by the coder 1102 as bits in which two bits are complementary to one another in each case. In this case, each check bit is transformed into two bits and stored in two memory cells. For example, a check bit 1 can be transformed into the bits 10 and a check bit 0 can be transformed into the bits 01 and respectively stored in two memory cells.

Other transformations of the check bits into memory cell values are also possible. For example, it is conceivable to write the check bits to the memory 1103 in an error-tolerant manner in triplicate or duplicate and/or in another manner.

In a group of n respective memory cells of the memory 1103, $n_1$ first values are stored in a first number of $n_1$ first memory cells, $n_2$ second values are stored in a second number of $n_2$ second memory cells, etc. up to $n_K$ Kth values stored in a predetermined Kth number of $n_K$ Kth memory cells. In this case: $n_1+n_2+ \ldots +n_K=n$.

In the circuit arrangement shown in FIG. 10, the errors are processed using the data bits. In contrast to this, in the circuit arrangement shown in FIG. 11, the errors are processed on the basis of the memory cell values determined from the data bits by the transformation circuit 1101. The memory cell values are memory bits, for example. In this case, error processing is understood as meaning error detection and/or error correction.

Figure 12:
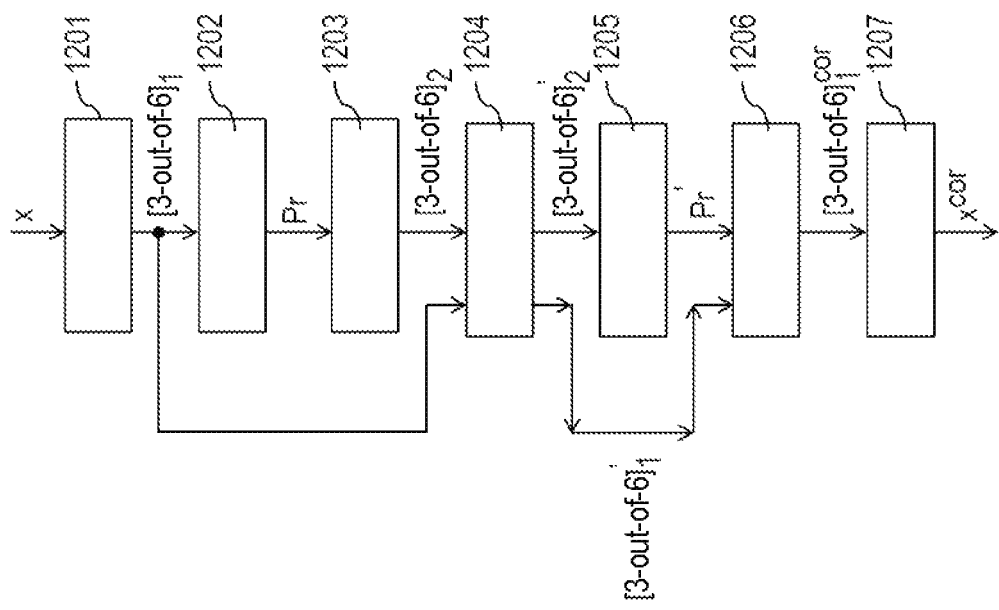
FIG. 12 shows another example of a variant of the circuit arrangement indicated in FIG. 11 with back-transformation and determination of possibly corrected data bits.

FIG. 12 shows another example of another embodiment of the circuit arrangement shown in FIG. 11.

Data bits x are present at the input of a transformation circuit 1201 and are transformed into code words [3-out-of-6]$_1$, wherein 4 bits of the data bits are respectively transformed into a 3-out-of-6 code word. These 3-out-of-6 code words [3-out-of-6]$_1$ are provided at the output of the transformation circuit 1201. A code word of the 3-out-of-6 code is assigned to each of the 16 4-bit values in a reversibly unique manner by the transformation circuit 1201.

The output of the transformation circuit 1201 is connected to the input of a check bit generator 1202 which determines check bits Pr for the bits of the 3-out-of-6 code words according to an error code and provides them at its output.

For example, the check bit generator 1202 generates check bits of a BCH code. The bits output by the transformation circuit 1201 and the check bits output by the check bit generator 1202 then form a code word of the BCH code in the error-free case.

In one embodiment, instead of the BCH code, it is accordingly also possible to use another error code. A plurality of error codes can also be used in combination.

The output of the transformation circuit 1201 is likewise connected to the input of a memory 1204, with the result that the 3-out-of-6 code words (also without check bits) obtained from the data bits by means of the transformation circuit 1201 can be stored in the memory 1204.

The output of the check bit generator 1202 is connected to the input of a check bit transformer 1203 which transforms the provided check bits into 3-out-of-6 code words [3-out-of-6]$_2$ and provides them at its output.

The output of the check bit transformer 1203 is connected to the input of the memory 1204. For example, separate data inputs of the memory can be used for this purpose. The 3-out-of-6 code words [3-out-of-6]$_2$ which have been generated by the check bit transformer 1203 on the basis of the check bits Pr can therefore be stored in the memory 1204.

In the error-free case, those bits which are 3-out-of-6 code words are stored in the memory 1204. These bits are also referred to as memory cell values.

Code words [3-out-of-6]$_1$ of the 3-out-of-6 code are formed from the data bits x by the transformation circuit 1201 and are written to the memory 1204. These code words [3-out-of-6]$_1$ form memory cell values for memory cells of the memory 1204.

Check bits Pr are determined from the bits of the code words [3-out-of-6]$_1$ by a check bit generator 1202 according to the error code used and are output at its output. The check bit transformer 1203 transforms the check bits Pr into code words [3-out-of-6]$_2$ of the 3-out-of-6 code. These code words [3-out-of-6]$_2$ form memory cell values for memory cells of the memory 1204 which have been formed from the check bits Pr.

The code words [3-out-of-6]$_1$ and the code words [3-out-of-6]$_2$ are therefore stored in the memory 1204. During storing or reading, bit errors may occur, on the basis of which the code words [3-out-of-6]$_1$ and the code words [3-out-of-6]$_2$ are corrupted into incorrect bits.

During reading, bits [3-out-of-6]'$_1$, which are assigned to the data bits, and bits [3-out-of-6]'$_2$, which are assigned to the check bits of the transformed data bits, are output from the memory 1204. The bits [3-out-of-6]'$_1$ and the bits [3-out-of-6]'$_2$ may contain bit errors. In the error-free case:

[3-out-of-6]'$_1$=[3-out-of-6]$_1$

[3-out-of-6]'$_2$=[3-out-of-6]$_2$.

The output of the memory 1204, at which the bits [3-out-of-6]'$_2$ are output, is connected to the input of an inverse check bit transformer 1205 which, on the basis of the bits [3-out-of-6]'$_2$, determines possibly incorrect check bits Pr' and provides them at its output. The inverse check bit transformer 1205 implements an inverse transformation to the transformation implemented by the check bit transformer 1203.

In the error-free case, the inverse check bit transformer 1205 outputs the same check bits Pr at its output as were formed by the check bit generator 1202.

The possibly incorrect check bits Pr' are the check bits of the bits [3-out-of-6]'$_1$ corresponding to the data bits. These possibly incorrect check bits Pr' can therefore be used to correct the possible bit errors of the bits [3-out-of-6]'$_1$ according to the 3-out-of-6 code used.

The output of the memory 1204 and the output of the inverse check bit transformer 1205 are each connected to an input of a corrector 1206. The corrector 1206 corrects the bits [3-out-of-6]'$_1$ into corrected bits [3-out-of-6]$^{cor}_1$ according to the error code used.

If errors which have possibly occurred can be corrected by means of the error code used, the following applies:

[3-out-of-6]$^{cor}_1$=[3-out-of-6]$_1$.

These bits [3-out-of-6]$^{cor}_1$ are provided at the output of the corrector 1206. The output of the corrector 1206 is connected to the input of an inverse transformation circuit 1207 which carries out a transformation which is inverse to the transformation carried out by the transformation circuit 1201. The data bits x$^{cor}$ are provided at the output of the inverse transformation circuit 1207. These are possibly corrected data bits or—if an error has not occurred—the data bits x.

If there is no error or if an error which has occurred can be corrected by means of the error code C, the following applies x$^{cor}$=x.

The circuit arrangement described is an exemplary embodiment in which the errors of memory cell values are corrected by means of an error code. In this exemplary embodiment, the binary memory cell values are code words of a 3-out-of-6 code. The 3-out-of-6 code is used to form memory cell values. The errors of the memory cell values can be corrected using an error code, for example a Hamming code, a Hsiao code, a BCH code or another code.

Data bits are therefore transformed into memory cell values and check bits of an error code are determined for the bits of the memory cell values. These check bits are now likewise transformed into memory cell values. The memory cell values of the transformed bits and of the transformed check bits are stored in the memory. During reading from the memory, the memory cell values corresponding to the check bits are then first of all transformed back into check bits. The memory cell values corresponding to the data bits are corrected into corrected memory cell values in a conventional corrector using the check bits which have been transformed back and using the error code. The corrected memory cell values corresponding to the data bits can then be transformed back into corrected data bits by means of an inverse transformation.

In addition to the memory cell values described and the 3-out-of-6 code described, it is also possible to accordingly use other memory cell values, for example code words of a 4-out-of-8 code.

In contrast to the embodiment described in FIG. 12, the errors of the data bits are corrected in the exemplary embodiment described in FIG. 10. Check bits of an error code are determined from the data bits. The data bits and the check bits determined in this manner are transformed together into memory cell values and stored in the memory. During reading from the memory, possibly incorrect memory cell values are first of all transformed back into possibly incorrect data bits and possibly incorrect check bits and the possibly incorrect data bits are corrected using the error code used.

Example: 3-Out-of-6 Code

A group of n=6 memory cells having two subgroups of $n_1=n_2=3$ memory cells each is assumed below by way of example. Therefore, 3-out-of-6 code words each having the binary value 0 three times and the binary value 1 three times can be stored in the n=6 memory cells.

There are $$\binom{6}{3} = 20$$

different code words containing three zeros and three ones, with the result that there are 20 different values which can be stored as 3-out-of-6 code words in 6 memory cells. Since $2^4=16<20$, 4 data bits can be stored in the 6 memory cells.

Table 9 shows a possible assignment of binary 4-bit values stored in 6 memory cells $S^1$ to $S^6$ as 3-out-of-6 code words. The last column in table 9 has the caption "4-bit"; there, the 4-bit values from 0 to 16 (compare penultimate column) are incremented bit by bit. There is precisely one code word of the 3-out-of-6 code used here by way of example for each 4-bit value. In this case, the 3-out-of-6 code is distinguished by the fact that the value 1 (or the value 0) occurs exactly three times in each code word. For the n=6 memory cells, there are 20−16=4 code words which are "spare", that is to say do not have an associated 4-bit value. In the example in table 9, these are the last four rows in the table in which the symbol "−" occurs four times in the column "4-bit".

TABLE 9

| $S^1$ | $S^2$ | $S^3$ | $S^4$ | $S^5$ | $S^6$ | Value | 4-bit |
|---|---|---|---|---|---|---|---|
| 1 | 1 | 1 | 0 | 0 | 0 | 0 | 0000 |
| 1 | 1 | 0 | 1 | 0 | 0 | 1 | 0001 |
| 1 | 0 | 1 | 1 | 0 | 0 | 2 | 0010 |
| 0 | 1 | 1 | 1 | 0 | 0 | 3 | 0011 |
| 1 | 1 | 0 | 0 | 1 | 0 | 4 | 0100 |
| 1 | 0 | 1 | 0 | 1 | 0 | 5 | 0101 |
| 0 | 1 | 1 | 0 | 1 | 0 | 6 | 0110 |
| 1 | 0 | 0 | 1 | 1 | 0 | 7 | 0111 |
| 0 | 1 | 0 | 1 | 1 | 0 | 8 | 1000 |
| 0 | 0 | 1 | 1 | 1 | 0 | 9 | 1001 |
| 1 | 1 | 0 | 0 | 0 | 1 | 10 | 1010 |
| 1 | 0 | 1 | 0 | 0 | 1 | 11 | 1011 |
| 0 | 1 | 1 | 0 | 0 | 1 | 12 | 1100 |
| 1 | 0 | 0 | 1 | 0 | 1 | 13 | 1101 |
| 0 | 1 | 0 | 1 | 0 | 1 | 14 | 1110 |
| 0 | 0 | 1 | 1 | 0 | 1 | 15 | 1111 |
| 1 | 0 | 0 | 0 | 1 | 1 | 16 | — |
| 0 | 1 | 0 | 0 | 1 | 1 | 17 | — |
| 0 | 0 | 1 | 0 | 1 | 1 | 18 | — |
| 0 | 0 | 0 | 1 | 1 | 1 | 19 | — |

Detection of the Fastest Read Current

Figure 13:
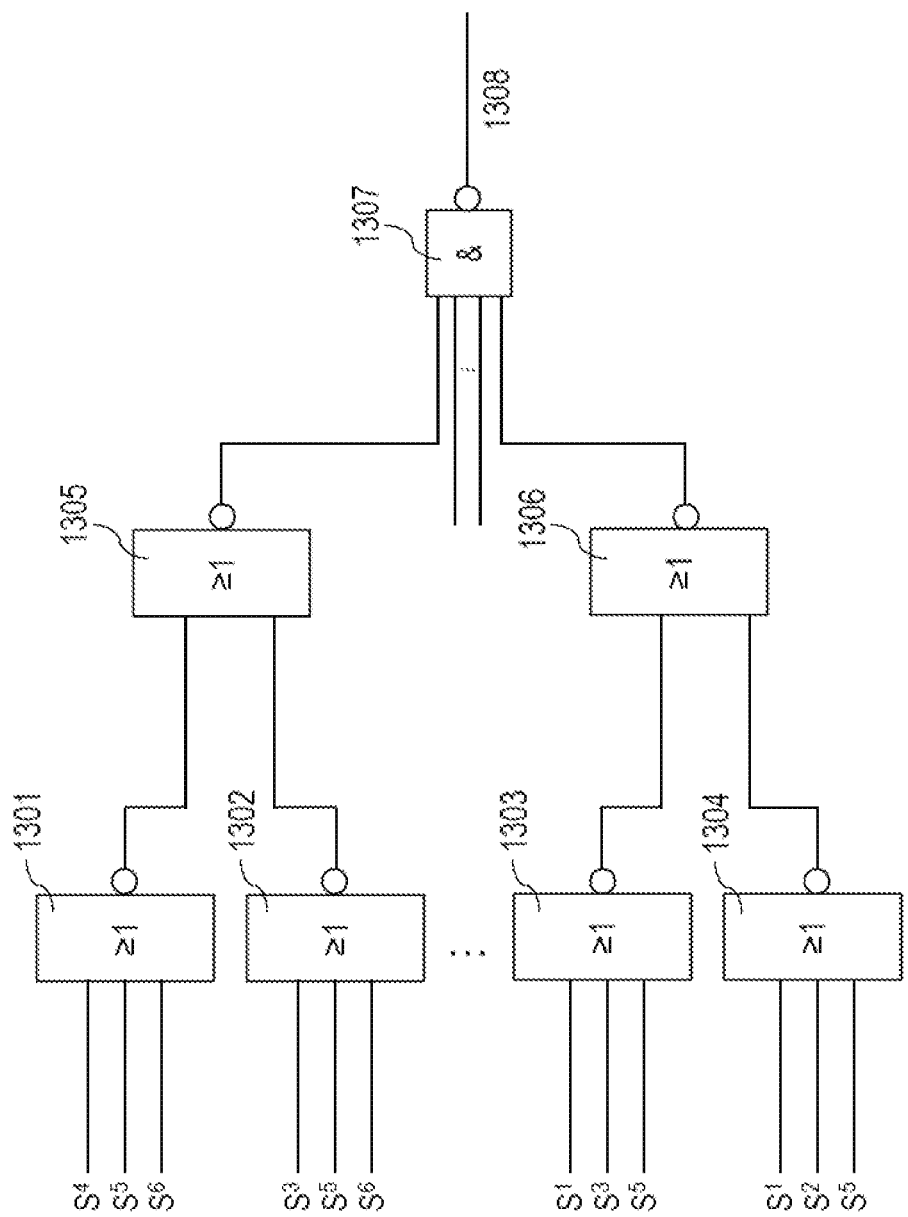
FIG. 13 shows an exemplary circuit arrangement comprising a plurality of logic gates for determining a hold signal for a plurality of latches.

FIG. 13 shows a circuit arrangement according to one embodiment comprising four NOR gates 1301 to 1304 each with three inputs, two NOR gates 1305, 1306 each with two inputs and one NAND gate 1307 with a multiplicity of inputs.

This circuit arrangement makes it possible to determine those three memory cells whose time integral of the read current reaches the predetermined threshold value Sw most quickly.

There are $$\binom{6}{3} = 20$$

different possible ways of assigning three zeros and three ones to three of the 6 memory cells $S^1$ to $S^6$.

The three outputs of the memory cells assigned 0 in the first 16 rows in table 9 are each connected to the inputs of a NOR gate. The output of a NOR gate is 1 only when all of its inputs are 0.

The three outputs of the memory cells $S^4$, $S^5$ and $S^6$, which have the value 0 according to the first row in table 9, are passed to the three inputs of the NOR gate 1301. The three outputs of the memory cells $S^3$, $S^5$ and $S^6$, which have the value 0 according to the second row in table 9, are passed to the three inputs of the NOR gate 1302. The three outputs of the memory cells $S^1$, $S^3$ and $S^5$, which have the value 0 according to row 14 in table 9, are passed to the three inputs of the NOR gate 1303. The three outputs of the memory cells $S^1$, $S^2$ and $S^5$, which have the value 0 according to row 15 in table 9, are passed to the three inputs of the NOR gate 1304.

This approach is accordingly also applied to rows 3 to 13, according to which a separate NOR gate is provided for each row, the three inputs of which gate are connected to those memory cells in the row which have the value 0.

The value 1 is present only at the output of that NOR gate 1301 to 1304 whose inputs all have the value 0. In other words, only that NOR gate 1301 to 1304 which is combined with the associated code word according to table 9 provides the value 1 at its output. Since the combinations of the connections of the inputs to memory cells are different at all of the NOR gates 1301 to 1304 (each code word contains a different arrangement of three zeros), the value 1 is present at the outputs of the NOR gates 1301 to 1304 only once at a time.

The NOR gates 1305 and 1306 illustrate, by way of example, a second level of combining logic signals in FIG. 13: the output of the NOR gate 1301 and the output of the NOR gate 1302 are connected to the inputs of the NOR gate 1305. The output of the NOR gate 1303 and the output of the NOR gate 1304 are connected to the inputs of the NOR gate 1306. Therefore, two of the outputs of the NOR gates 1301 to 1304 are each connected to the inputs of a NOR gate on this second level.

The outputs of the NOR gates 1305 to 1306 on the second level are each connected to one input of the NAND gate 1307. A signal 1308 is provided at the output of the NAND gate 1307.

The NAND gate provides the value 0 at its output only when all of its inputs have the value 1. As soon as one of the inputs has the value 0, the signal 1308 has the value 1. As stated above, only one of the NOR gates 1301 to 1304 can change from the value 0 to the value 1 at its output when three zeros occur in the memory cells. Accordingly, the NOR gate 1305 to 1306 connected to the output of the affected NOR gate 1301 to 1304 changes from the value 1 to the value 0. This value 0 causes the signal 1308 to change to the value 1.

In the embodiment shown in FIG. 13, there are 16 different possible ways of distributing three zeros to 6 memory cells (compare table 9). Accordingly, there are 16 NOR gates 1301 to 1304. The outputs of two of these NOR gates in each case are passed to the inputs of one of the NOR gates 1305 to 1306 on the second level. Therefore, there are 8 NOR gates 1305 to 1306 on the second level and the NAND gate 1307 accordingly has eight inputs.

The signal 1308 at the output of the NAND gate 1307 can be sampled over time.

If the value 1 is determined for the signal 1308 for the first time during sampling, the signal 1308 can be used as a "hold signal" for 6 latches which are connected downstream of the respective memory elements $S^1$ to $S^6$. This is explained in more detail with regard to FIG. 14.

Figure 14:
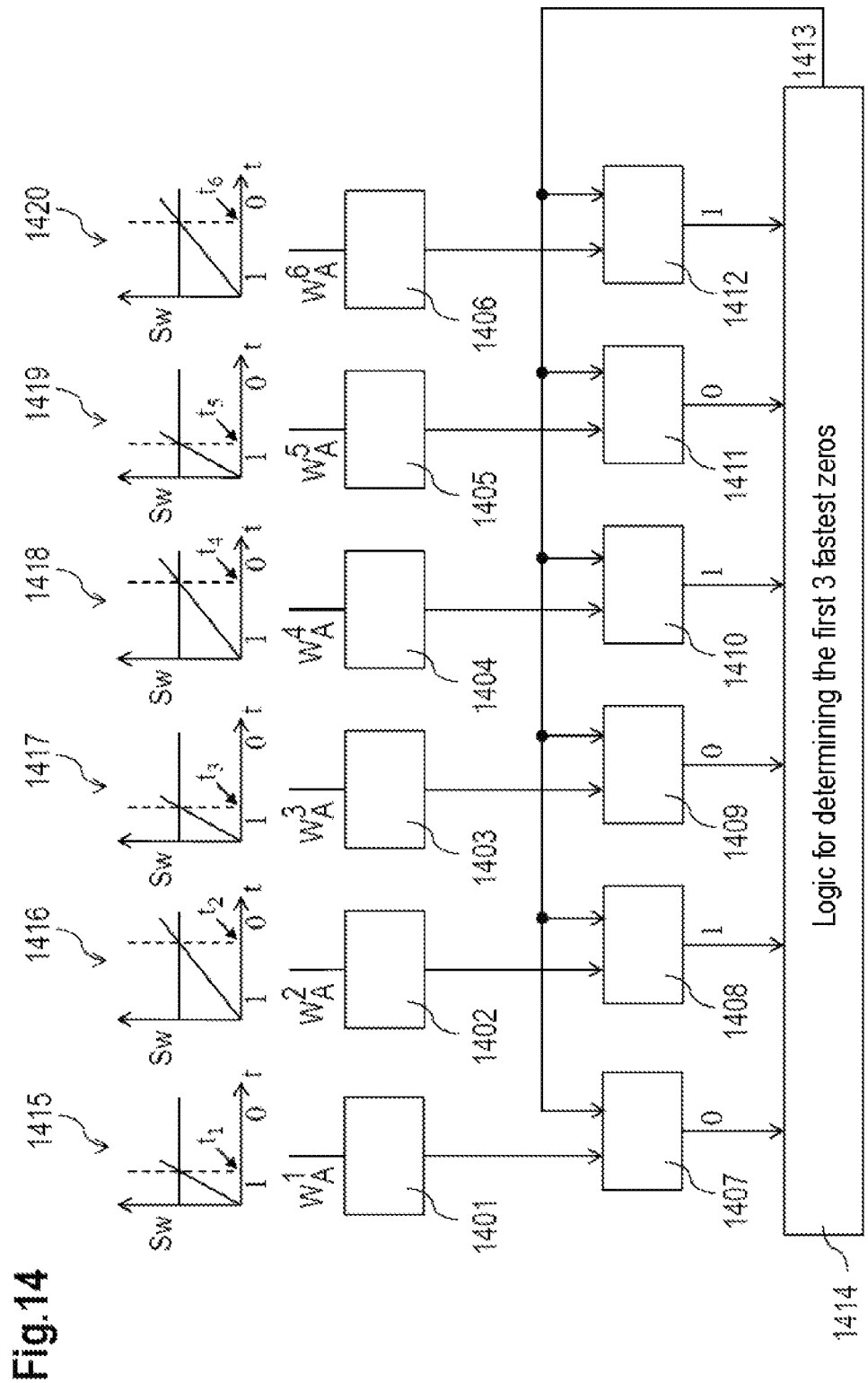
FIG. 14 shows an exemplary circuit arrangement for determining the first three fastest zeros when reading six memory cells, wherein the hold signal generated by means of the circuit arrangement from FIG. 13 is used to control a plurality of latches.

FIG. 14 shows an exemplary circuit arrangement comprising six signal amplifiers (also referred to as sense amplifiers) 1401 to 1406. As already explained above, physical values $W_A^i$ (here with i=1 . . . 6) are read from (here, for example, 6) memory cells of the memory. One of the physical values $W_A^i$ which have been read is supplied to one of the signal amplifiers 1401 to 1406. The physical value $W_A^i$ may be a read current.

The signal amplifier 1401 determines a time integral of the physical value $W_A^1$. If the time integral is less than a threshold value Sw at a time t, the digital value 1 is present at the output of the signal amplifier 1401 at the time t. If the time integral is greater than the threshold value Sw at the time t, the digital value 0 is present at the output of the signal amplifier 1401. The output of the signal amplifier 1401 is connected to the first input of a latch 1407, at the second input of which a hold signal 1413 is present. If the value of the hold signal is equal to 0, the latch 1407 is switched to be transparent, that is to say the binary value provided at the output of the signal amplifier 1401 is present at the first input of a logic circuit 1414. If the value of the hold signal is equal to 1, the latch 1407 is frozen, that is to say the value present at the first input of the latch 1407 at this time also remains at the output of the latch 1407 as long as the value of the hold signal is equal to 1.

With regard to the function of the latch, which is also referred to as a state-controlled flip-flop, reference is made to "de.wikipedia.org/wiki/Latch", for example.

The logic circuit 1414 determines the first three zeros, that is to say the fastest three zeros, which occur at the outputs of the latches 1407 to 1412 and then sets the hold signal 1413 to the value 1.

The following accordingly apply: the signal amplifier 1402 determines a time integral of the physical value $W_A^2$. If the time integral is less than the threshold value Sw at the time t, the digital value 1 is present at the output of the signal amplifier 1402 at the time t. If the time integral is greater than the threshold value Sw at the time t, the digital value 0 is present at the output of the signal amplifier 1402. The output of the signal amplifier 1402 is connected to the first input of a latch 1408, at the second input of which the hold signal 1413 is present. The output of the latch 1408 is connected to the second input of the logic circuit 1414. The signal amplifier 1403 determines a time integral of the physical value $W_A^3$. If the time integral is less than the threshold value Sw at the time t, the digital value 1 is present at the output of the signal amplifier 1403 at the time t. If the time integral is greater than the threshold value Sw at the time t, the digital value 0 is present at the output of the signal amplifier 1403. The output of the signal amplifier 1403 is connected to the first input of a latch 1409, at the second input of which the hold signal 1413 is present. The output of the latch 1409 is connected to the third input of the logic circuit 1414. The signal amplifier 1404 determines a time integral of the physical value $W_A^4$. If the time integral is less than the threshold value Sw at the time t, the digital value 1 is present at the output of the signal amplifier 1404 at the time t. If the time integral is greater than the threshold value Sw at the time t, the digital value 0 is present at the output of the signal amplifier 1404. The output of the signal amplifier 1404 is connected to the first input of a latch 1410, at the second input of which the hold signal 1413 is present. The output of the latch 1410 is connected to the fourth input of the logic circuit 1414. The signal amplifier 1405 determines a time integral of the physical value $W_A^5$. If the time integral is less than the threshold value Sw at the time t, the digital value 1 is present at the output of the signal amplifier 1405 at the time t. If the time integral is greater than the threshold value Sw at the time t, the digital value 0 is present at the output of the signal amplifier 1405. The output of the signal amplifier 1405 is connected to the first input of a latch 1411, at the second input of which the hold signal 1413 is present. The output of the latch 1411 is connected to the fifth input of the logic circuit 1414. The signal amplifier 1406 determines a time integral of the physical value $W_A^6$. If the time integral is less than the threshold value Sw at the time t, the digital value 1 is present at the output of the signal amplifier 1406 at the time t. If the time integral is greater than the threshold value Sw at the time t, the digital value 0 is present at the output of the signal amplifier 1406. The output of the signal amplifier 1406 is connected to the first input of a latch 1412, at the second input of which the hold signal 1413 is present. The output of the latch 1412 is connected to the sixth input of the logic circuit 1414.

For example, a graph 1415 shows a read current over time for signal amplifier 1401. According to this, the read current at the signal amplifier 1401 reaches the threshold value Sw at a time $t_1$. Accordingly, FIG. 14 also shows graphs 1416 to 1420 for the signal amplifiers 1402 to 1406, according to which a time $t_i$ indicates when the ith signal amplifier 1401 to 1406 reaches the threshold value Sw.

As long as the integral of the read current is less than the threshold value Sw up to the time $t_i$, the respective signal amplifier outputs the value 1; if the integral of the read current is greater than the threshold value Sw after the time $t_i$, the respective signal amplifier outputs the value 0.

In the embodiment shown in FIG. 14, the physical values $W_A^1$ to $W_A^6$ are determined at a time t, wherein t is greater than $t_1$, $t_3$ and $t_5$ and wherein t is less than $t_2$, $t_4$ and $t_6$. The value 0 is therefore respectively present at the outputs of the signal amplifiers 1401, 1403 and 1405 at the time t, whereas the value 1 is still present at the outputs of the signal amplifiers 1402, 1404 and 1406. The logic circuit 1414 detects these first three zeros and changes the hold signal 1413 from 0 to 1 and the latches 1407 to 1412 are then "frozen".

The logic circuit 1414 may be implemented, for example, by means of the circuit arrangement illustrated in FIG. 13.

The invention claimed is:

1. A method for reading memory cells from a memory, comprising:
   determining physical values from a number of n memory cells, wherein n is at least three using determination circuitry,
   at least partially comparing the physical values with one another using comparison circuitry,
   assigning K different digital memory cell values to the n memory cells based on the compared physical values, and
   assigning a code word of an $n_1$-, . . . ,$n_K$-out-of-n code to the digital memory cell values,
   wherein the physical values are at least partially compared with one another, with the result that a sequence of at least some of the physical values is determined, and
   wherein the K different digital memory cell values are assigned to the n memory cells based on the sequence.

2. The method as claimed in claim 1, wherein the physical values are determined by reading the n memory cells.

3. The method as claimed in claim 1, wherein at least partially comparing comprises comparing all physical values with one another.

4. The method as claimed in claim 1, wherein K =2, with the result that the $n_1$-, . . . ,$n_K$-out-of-n code is an $n_1$-,$n_2$-out-of-n code, wherein $n_1$ first memory cell values have a same first value among one another and $n_2$ second memory cell values have a same second value among one another, and wherein the first value differs from the second value.

5. The method as claimed in claim 1, wherein K =3, with the result that the $n_1$-, . . . ,$n_K$-out-of-n code is an $n_1$-,$n_2$-,$n_3$-out-of-n code, wherein $n_1$ first memory cell values have a same first value among one another, $n_2$ second memory cell values have a same second value among one another and $n_3$ third memory cell values have a same third value among one another, and wherein the first value, the second value and the third value each differ from one another.

6. The method as claimed in claim 1, wherein K>3.

7. The method as claimed in claim 1, wherein the memory cell values determined from the memory cells are determined by means of a uniquely reversible transformation.

8. The method as claimed in claim 1, wherein the physical values are times.

9. The method as claimed in claim 8, each of the times are respectively determined by integrating the respective physical value of the memory cell over time.

10. The method as claimed in claim 1, wherein the physical value is a read current of a memory cell.

11. The method as claimed in claim 1, wherein, if the obtained digital memory cell values are a code word of an $n_1$-, ..., $n_K$-out-of-n code, a number of m bits is determined from the code word by means of a back-transformation.

12. The method as claimed in claim 11, further comprising performing error detection and/or error correction of the m bits by means of an error code.

13. The method as claimed in claim 12, wherein the error code is a byte error-correcting and/or a byte error-detecting code.

14. The method as claimed in claim 13, wherein a byte comprises m bits if error correction of data bits is carried out, and wherein a byte comprises n bits if error correction of memory cells is carried out.

15. The method as claimed in claim 12, wherein the error code is a bit error-correcting and/or a bit error-detecting code.

16. The method as claimed in claim 11, further comprising performing error detection and/or error correction based on check bits, wherein the check bits are determined from the data bits according to the error code.

17. The method as claimed in claim 11, further comprising performing error detection and/or error correction based on check bits, wherein the check bits are determined from the memory cell values according to the error code.

18. The method as claimed in claim 1, further comprising using at least one reference value to determine the digital memory cell values.

19. The method as claimed in claim 1, wherein the memory comprises at least one of the following memory types:
   a cache memory,
   a register or a register array,
   a flash memory,
   an MRAM,
   an SRAM,
   an RE-RAM,
   a PC-RAM,
   an FE-RAM,
   a CB-RAM,
   a multi-bit memory,
   a multi-level memory.

20. An apparatus for processing memory cells from a memory, comprising:
   a processing circuit configured to:
      determine physical values from a number of n memory cells, wherein n is at least three,
      at least partially compare the physical values with one another,
      assign K different digital memory cell values to the n memory cells on the basis of the compared physical values, and
      assign a code word of an $n_1$-, ..., $n_K$-out-of-n code to the digital memory cell values obtained in this manner,
   wherein the processing circuit is further configured to:
      at least partially compare the physical values with one another and thus to determine a sequence of the physical values, and
      assign the K different digital memory cell values to the n memory cells on the basis of the sequence of the physical values.

21. A non-transitory computer-readable storage medium comprising instructions which can be executed by a computer and which are suitable for the computer to carry out acts of a method, comprising:
   determining physical values from a number of n memory cells, wherein n is at least three using determination circuitry,
   at least partially comparing the physical values with one another using comparison circuitry,
   assigning K different digital memory cell values to the n memory cells based on the compared physical values, and
   assigning a code word of an $n_1$-, ..., $n_K$-out-of-n code to the digital memory cell values.

* * * * *